United States Patent Office 3,723,123
Patented Mar. 27, 1973

3,723,123

MULTICOLOR REPRODUCTIONS

Rexford W. Jones and William B. Thompson, Columbus, Ohio, assignors to A. E. Staley Manufacturing Company, Decatur, Ill.

No Drawing. Continuation-in-part of applications Ser. No. 796,897, Feb. 5, 1969, now abandoned, Ser. No. 833,771, June 16, 1969, now Patent No. 3,677,759, and Ser. No. 849,493, Aug. 12, 1969, now abandoned. This application Mar. 10, 1971, Ser. No. 123,083
Int. Cl. G03c *5/24;* B05c *1/16*
U.S. Cl. 96—48 46 Claims

ABSTRACT OF THE DISCLOSURE

The method of forming a multicolor reproduction which comprises: coating a substrate bearing a first color in image-wise configuration with a solid, light-sensitive organic layer having a thickness of at least 0.1 micron while maintaining said first color in its image-wise configuration, said light-sensitive organic layer being capable of developing a $R_d$ of 0.2 to 2.2; exposing said light-sensitive organic layer to actinic radiation in image-receiving manner to establish a potential $R_d$ of 0.2 to 2.2; applying to said layer of organic material, free flowing powder particles of a second color having a diameter, along at least one axis, of at least about 0.3 micron but less than 25 times the thickness of said organic layer; while the layer is at a temperature below the melting points of the powder and of the organic layer, embedding said powder particles as a monolayer in a stratum at the surface of said light-sensitive layer to yield an image having portions varying in density in proportion to the exposure of each portion; and removing non-embedded particles from said organic layer to develop a multicolor reproduction.

DISLOSURE OF THE INVENTION

This application is a continuation-in-part of application Ser. No. 796,897, filed Feb. 5, 1969, now abandoned, application Ser. No. 833,771, filed June 16, 1969, now Pat. No. 3,677,759, and application Ser. No. 849,493, filed Aug. 12, 1969, now abandoned.

This invention relates to a method of forming multicolor reproductions wherein a substrate bearing a first color in image-wise configuration in or on the surface of said substrate is coated with a solid, light-sensitive organic layer while maintaining said first color in its image-wise configuration, exposed to actinic radiation and developed by embedding powder particles of a second color into a stratum at the surface of the exposed solid, light-sensitive organic layer. More particularly, this invention relates to a method of forming multicolor reproductions wherein a substrate bearing a first color in image-wise configuration, initially produced by deformation imaging, in or on the surface of said substrate is coated with a solid, light-sensitive organic layer while maintaining said first color in its image-wise configuration, exposed to actinic radiation and developed by embedding particles of a second color into a stratum at the surface of the exposed solid, light-sensitive organic layer.

In commonly assigned applications Ser. Nos. 796,847, now Pat. No. 3,637,385 and 796,897, filed Feb. 5, 1969 and Ser. No. 833,771, filed June 16, 1969, which are all hereby incorporated by reference, there is described and claimed a method of forming deformation images wherein the deformation image is developed by embedding particles into a stratum at the surface of a powder-receptive, solid, light-sensitive organic layer and techniques for molecularly dispersing particulate dye in or on the surface of substrates. The deformation images initially produced comprise a substrate bearing a solid, organic layer containing a monolayer of powder particles displacing at least a portion of the organic layer, wherein said particles are held in the depressions so created in image-wise configuration.

As pointed out in these applications, these processes are ideally suited for forming permanent line, continuous-tone and half-tone reproductions directly in or on a light-sensitive element. While the processes are described chiefly with respect to the production of single color reproductions, it is also desirable to produce multicolor reproductions directly in or on a single substrate. For example, multicolor printing jobs are commonly produced by forming p'ates from three or four color separation positives (cyan, magenta, yellow and in most cases black) and using each of the plates to print a single color on paper. In order to obtain an accurate indication of the tone and color reproduction capabilities of the separation positives prior to making the plates, it is desirable to simulate the final product using the color separation positives. Further, color proofs are often required by the customer before printing and are useful for various other internal purposes within the print shop. In order to simulate the appearance and overlay of ink coolrs, it is necessary, when employing photographic processes, to deposit each color photographically on top of the preceding color using the separation positives. While numerous photographic color proofing processes have been developed, they are, generally, undependable, expensive extremely time-consuming and/or require painstaking care. Likewise, in the production of color television tubes, it is conventional to photographically deposit each of the three phosphors painstakingly in separate photographic steps onto a glass face plate. Accordingly, there is a need for relatively simple photographic processes wherein multicolor reproductions can be developed directly in or on a single substrate.

The general object of this invention is to provide new methods of forming multicolor reproductions. A more specific object of this invention is to provide a new method for forming multicolor reproductions on a single substrate. Another object of this invention is to provide a new method for forming multicolor reproductions utilizing deformation imaging. Other objects will appear hereinafter.

In the description that follows, the phrase "powder-receptive, solid, light-sensitive organic layer" is used to describe an organic layer which is capable of developing a predetermined contrast or reflection density ($R_d$) upon exposure to actinic light and embedment of black powder particles of a predetermined size in a single stratum at the surface of said organic layer. While explained in greater detail below, the $R_d$ of a light-sensitive layer is a photometric measurement of the difference in degree of blackness of undeveloped areas and black-powder developed areas. The terms "physically embedded" or "physical force" are used to indicate that the powder particle is subjected to an external force other than, or in addition to, either electrostatic force or gravitational force resulting from dusting or sprinkling powder particles on a substrate. The terms "mechanically embedded" or "mechanical force" are used to indicate that the powder particle is subjected to a manual or machine force, such as a lateral to-and-fro or circular rubbing or scrubbing action. The term "embedded" is used to indicate that the powder particle displaces at least a portion of the light-sensitive layer and is held in the depression so created, i.e. at least a portion of each particle is below the original surface of the light-sensitive layer. The term "vehicle" is used to refer to liquids used as solvents or suspending agents for depositing a solid, light-sensitive organic layer on a substrate.

In one aspect, this invention is a process of forming multicolor reproductions which comprises coating a substrate bearing a first color in image-wise configuration in or on the surface of said substrate with a solid, light-sensitive organic layer having a thickness of at least 0.1 micron while maintaining said first color in its image-wise configuration, said light-sensitive organic layer being capable of developing a $R_d$ of 0.2 to 2.2; exposing said light-sensitive organic layer to actinic radiation in image-receiving manner to establish a potential $R_d$ of 0.2 to 2.2; applying to said layer of organic material free flowing powder particles of a second color having a diameter along at least one axis of at least about 0.2 micron but less than 25 times the thickness of said organic layer; while the layer is at a temperature below the melting points of the powder and of the organic layer, physically embedding said powder particles as a monolayer in a stratum at the surface of said light-sensitive layer to yield an image having portions varying in density in proportion to the exposure of each portion; and removing non-embedded particles from said organic layer to develop a multicolor reproduction.

In a second aspect, this invention is a process of forming a multicolor reproduction which comprises: exposing to actinic radiation in image-receiving manner an element comprising a substrate bearing a first solid, light-sensitive organic layer capable of developing a $R_d$ of 0.2 to 2.2; continuing the exposure to establish a potential $R_d$ of 0.2 to 2.2; applying to said first layer of organic material, free flowing powder particles of a first color having a diameter along at least one axis of at least about 0.3 micron but less than 25 times the thickness of said first organic layer; while the element is at a temperature below the melting points of the powder and of the first organic layer, physically embedding said powder particles as a monolayer in a stratum at the surface of said first light-sensitive layer to yield an image having portions varying in density in proportion to the exposure of each portion; removing non-embedded particles from said first organic layer to develop an image; coating said element with a second solid, light-sensitive organic layer having a thickness of at least 0.1 micron while maintaining said first color in its image-wise configuration, said second light-sensitive organic layer being capable of developing a $R_d$ of 0.2 to 2.2; exposing said second light-sensitive organic layer to actinic radiation in image-receiving manner to establish a potential $R_d$ of 0.2 to 2.2; applying to said second layer of organic material, free flowing powder particles of a second color having a diameter along at least one axis of at least about 0.3 micron but less than 25 times the thickness of said second organic layer; while the element is at a temperature below the melting points of the second powder and of the second organic layer, physically embedding said powder particles as a monolayer in a stratum at the surface of said second light-sensitive layer to yield an image having portions varying in density in proportion to the exposure of each portion; and removing non-embedded particles from said second organic layer to develop a multicolor reproduction.

In a third aspect, this invention is a method of forming a multicolor reproduction which comprises treating a substrate bearing a solid organic layer holding a monolayer of powder particles comprising a dye of a first color held in image-wise configuration, with vapors of a material which is a solvent for said dye and capable of swelling the surface of said substrate, molecularly dispersing said dye into said substrate; removing said solid organic layer with a solvent for said layer while maintaining said molecularly imbibed image in its image-wise configuration; coating said element with a solid, light-sensitive organic layer having a thickness of at least 0.1 micron while maintaining said first color in its image-wise configuration, said light-sensitive organic layer being capable of developing a $R_d$ of 0.2 to 2.2; exposing said light-sensitive organic layer to actinic radiation in image-receiving manner to establish a potential $R_d$ of 0.2 to 2.2; applying to said layer of said organic material free flowing powder particles of a second color having a diameter along at least one axis of at least about 0.3 micron but less than 25 times the thickness of said organic layer; while the layer is at a temperature below the melting points of the powder and of the organic layer, physically embedding said powder particles as a monolayer in a stratum at the surface of said light-sensitve layer to yield an image having portions varying in density in proportion to the exposure of each portion; and removing non-embedded particles from said organic layer to develop a multicolor reproduction.

The objects of this invention can be attained by coating a substrate bearing a first color in image-wise configuration in or on the surface of said substrate (preferably one initially produced by deformation imaging) with a solid, light-sensitive organic layer while maintaining said first color in its image-wise configuration; exposing said light-sensitive organic layer to actinic radiation in image receiving manner; and embedding particles of a second color into a stratum at the surface of the exposed solid, light-sensitive organic layer. If desired, a third or fourth color etc., can be deposited in the same manner by coating the substrate with additional solid, light-sensitive organic layers while maintaining the first colors in image-wise configuration; exposing the light-sensitive layer to actinic radiation in image-receiving manner; and embedding particles of the new color into a stratum at the surface of the exposed solid, light-sensitive organic layer. For purposes of this invention, it is essential that each solid, light-sensitive organic layer be deposited on the substrate bearing the first color or colors without destroying the image-wise configuration of the first color or colors.

Numerous techniques can be employed to deposit a solid, light-sensitive organic layer on a previously imaged substrate while maintaining the first color or colors in image-wise configuration. Some of these techniques, such as those where the light-sensitive organic material is deposited from a liquid vehicle, are limited to some extent by the solubility characteristics of the components of the developing powders, surface of the substrate, light-sensitive organic layers, treatment of the substrate or first image, etc. For example, image fidelity may be lost if a substrate bearing a first solid, light-sensitive organic layer holding a monolayer of powder particles of a first color is coated with a second light-sensitive organic layer from a vehicle, that is a good solvent for the first light-sensitive layer or one of the components of the powder particles of the first color. On the other hand, some techniques, such as those where the light-sensitive organic layer is deposited on the substrate in the substantial absence of a liquid vehicle, impose substantially no restriction on the components of the developing powder, surface of the substrate, treatment of the substrate, light-sensitive organic layer, etc. Typical systems without liquid vehicle include lamination of preformed light-sensitive organic layers to the substrate, deposition of a dry light-sensitive organic layer from an aerosol held at a sufficient distance from the substrate to permit substantially all of the propellant to evaporate before the solid organic layer deposits on the substrate, etc.

Although there are numerous problems implicit in depositing subsequent light-sensitive layers from a liquid vehicle onto an image of a first color, particularly one initially produced by deformation imaging, this technique, as pointed out in application Ser. Nos. 796,847 and 796,897, is the preferred method of applying a light-sensitive layer to a substrate due to its operational simplicity. Accordingly, the process of this invention is described with particular reference to the variations possible where the light-sensitive layer is deposited from a liquid vehicle onto an image of a first color originally produced by deformation imaging.

Broadly speaking, the parameters affecting the deposit of a second light-sensitive organic layer from a liquid vehicle onto a substrate bearing a first color in image-wise configuration are dependent upon how the first color is held in or on the substrate. In very simplified terms, there are at least three different mechanisms by which each image, originally produced by deformation imaging, can be held in or on the substrate. First, as explained above, the deformation images initially produced are permanently held on the surface of the substrate by the solid, originally light-sensitive organic layer. Second, if the powder particles of the originally produced deformation image comprise a suitable fusible material, the powder particles can be fused to the substrate by heat and/or solvent vapors. Third, if the powder particles comprise a dye, the dye can be imbibed into the surface of the substrate with vapors of a material which is a solvent for the dye and capable of swelling the surface of the substrate. Accordingly, each color can be held in or on the substrate by embedment into the originally light-sensitive organic layer, by fusion to the surface of the substrate or by imbibition into the surface of the substrate.

In order to avoid impairment of the image-wise configuration of previously deposited color or colors, the second or subsequent light-sensitive layers should only be coated directly onto the substrate bearing the first color in image-wise configuration from a vehicle where the vehicle is a relatively poor solvent (1) for the originally light-sensitive solid organic layer and powder particles, when the previously deposited color or colors are held by embedment in the originally light-sensitive solid organic layer, (2) for the components of the fused powder particles when the previously deposited color or colors are fused to the surface of the substrate or (3) for the surface of the substrate when the dye is imbibed into the surface of the substrate.

Numerous techniques can be employed to alter the solubility characteristics of the surface of the aforesaid three different types of images, substrates and/or individual components of the images. For example, various polyfunctional compounds known to interact with one or more of the aforesaid components can be applied to the first color and reacted prior to the application of the second light-sensitive organic layer. Suitable polyfunctional compounds include polyvalent metal salts, dimethylol urea, urea-formadehyde resins, melamine-formaldehyde resins, etc. In some cases it may be desirable to treat the first image with diethylenically unsaturated polymerizable vinylidene monomers, dichromate or dichromated colloids and tan the layer to an infusible form with actinic radiation. In other cases, the solubility characteristics of the originally light-sensitive layer may be altered after development by uniform light-exposure. For example, the unexposed portions of solid, light-sensitive organic layers comprising a thermoplastic polymer and diethylenically unsaturated polymerizable vinylidene monomer can be converted into a thermoset state by uniform actinic radiation.

Alternatively, the first developed light-sensitive layer can be overcoated with a substantially colorless isolating layer in order to alter the solubility characteristics of the surface of the substrate upon which the second light-sensitive layer is deposited. For example, when employing a hydrocarbon-soluble, water-insoluble light-sensitive system in both the first and second layers, a hydrophilic layer, such as polyvinyl alcohol, can be deposited as an isolating barrier between the two light-sensitive layers.

In its preferred aspect, this invention makes use of the discoveries that (1) thin layers of many solid organic materials, some in substantially their naturally occurring or manufactured forms and others, including additives to control their powder receptivity and/or sensitivity to actinic radiation, can have surface properties that can be varied within a critical range by exposure to actinic radiation between a particle-receptive condition and a particle-non-receptive condition such that, by the methods of the present invention, continuous-tone images of high quality can be formed as well as line images and half-tones and (2) multicolor reproductions can be produced readily, provided each solid light-sensitive layer is applied to the substrate bearing a first color or colors in image-wise configuration while maintaining the first color or colors in image-wise configuration. As explained below, the particle receptivity and particle non-receptivity of the solid thin layers are dependent on the size of the particles, the thickness of the solid thin layer and the development conditions, such as layer temperature.

Broadly speaking, the deformation imaging of the present invention differs from known processes in various subtle and unobvious ways. For example, the particles that form an image are not merely dusted on, but instead are applied against the surface of the light-sensitive thin layer under moderate physical force. The relatively soft or particle-receptive nature of the light-sensitive layer is such that substantially a monolayer of particles, or isolated small agglomerates, are at least partially embedded in a stratum at the surface of the light-sensitive layer by moderate physical force. The surface condition in the particle-receptive areas is at most only slightly soft but not fluid, as in prior processes. The relatively hard or particle-non-receptive condition of the light-sensitive surface in the non-image areas is such that when particles of a predetermined size are applied under the same moderate physical force few, if any, are embedded sufficiently to resist removal by moderate dislodging action such as blowing air against the surface.

The ease with which continuous tone deformation images are produced is significant. In various preferred forms of this invention, the light-sensitive organic layer is sensitized to actinic radiation in such manner that a determinable quantity of actinic radiation changes the surface of the film from the particle receptive condition to the non-receptive condition. The unexposed areas accept a maximum concentration of particles while fully exposed areas accept no particles. In others, the light-sensitive organic layer is sensitive to actinic radiation in the opposite way, such that a determinable quantity of such radiation changes the surface of the film from the particle non-receptive condition to the receptive condition. In both types of layers, the sensitivity typically is such that smaller quantities of actinic radiation provide proportionately smaller changes in the surface of the layer to provide a continuous range of particle receptive conditions between fully receptive and non-receptive conditions. Thus, the desired image may include intermediate light values, as are typically produced by actinic radiation through a continuous tone transparency. While the continuous nature of images produced by the method of this invention cannot be fully explained from a technical standpoint, microscropic studies have established that the range of $R_d$ (reflection density) obtainable is attributable to the number of particles embedded per unit area. Since only a monolayer of particles is embedded, the light-sensitive layer can be viewed functionally as an ultrafine screen yielding continuous tone images. No such results have been reported in prior powder-imaging methods, even those using some of the same materials but in different modes from those of the present invention. This is probably due to the fact that prior powder-imaging processes rely on electrostatics or liquefaction of the unexposed areas, which lead to the formation of multilayers of powder particles, precluding the formation of continuous tone images.

The quality of the deformation images is superior to that of prior powder-imaging processes. Line images free of background, having good density and high resolution (better than 40 line pairs per mm.) are readily obtained. As explained below, half-tone reproductions and continuous-tone images are also provided readily. The images obtainable compare favorably with silver halide photographs.

For use in this invention, the solid, light-sensitive organic layer, which can be an organic material in its naturally occurring or manufactured form or a mixture of said organic material with plasticizers and/or photoactivators for adjusting the powder receptivity and sensitivity to actinic radiation, must be capable of developing a predetermined contrast or $R_d$ using a suitable black developing powder under the conditions of development. The powder-receptive areas of the layer (unexposed areas of a positive-acting, light-sensitive material or the exposed areas of a negative-acting, light-sensitive material) must have a softness such that suitable particles can be embedded into a stratum at the surface of the light-sensitive layer by mild physical force. However, the layer should be sufficiently hard and non-sticky that film transparencies can be pressed against the surface, as in vacuum frame, without the surfaces sticking together or being damaged even when heated slightly under high intensity light radiation. The film should also have a degree of toughness so that it maintains its initegrity during development. If the $R_d$ of the light-sensitive layer is below about 0.2, the light-sensitive layer is too hard to accept a suitable concentration of powder particles. On the other hand, if the $R_d$ is above about 2.2, the light-sensitive layer is so soft that it is difficult to maintain film integrity during physical development and the layer tends to adhere to transparencies precluding the use of vacuum frame exposure equipment. Further, if the $R_d$ is above 2.2, the light-sensitive layer is so soft that more than one layer of powder particles may be deposited with attendant loss of continuous-tone quality and image fidelity and the layer may be displaced by mechanical forces resulting in distortion or destruction of the image. Accordingly, for use in this invention, the light-sensitive layer must be capable of developing a $R_d$ within the range of 0.2 to 2.2 or preferably 0.4 to 2.0 using a suitable black developing powder under the conditions of development.

The $R_d$ of a positive-acting, light-sensitive layer, which is called $R_{dp}$, is a photometric measurement of the reflection density of a black powder developed light-sensitive layer after a positive-acting, light-sensitive layer has been exposed to sufficient actinic radiation to convert the unexposed areas (or most exposed areas, when a continuous-tone transparency is used) into a substantially powder-non-receptive state (clear the background). The $R_d$ of a negative-acting, light-sensitive layer which is called $R_{dn}$, is a photometric measurement of the reflection density of a black powder developed area, after a negative-acting, light-sensitive layer has been exposed to sufficient actinic radiation to convert the exposed area into a powder-receptive area.

In somewhat greater detail, the reflection density of a solid, positive-acting, light-sensitive layer ($R_{dp}$) is determined by coating the light-sensitive layer on a white substrate, exposing the light-sensitive layer to sufficient actinic radiation image-wise to clear the background of the solid positive-acting, light-sensitive layer, applying a black powder (prepared from 77% Pliolite VTL and 23% Neo Spectra carbon black in the manner described below) to the exposed layer, physically embedding said black powder under the conditions of development as a monolayer in a stratum at the surface of said light-sensitive layer and removing the non-embedded particles from said light-sensitive layer. The developed organic layer containing black powder embedded image areas and substantially powder free non-image areas is placed in a standard photometer having a scale reading from 0 to 100% reflection of incident light or an equivalent density scale, such as on Model 500 A photometer of the Photovolt Corporation. The instrument is zeroed (0 density; 100% reflectance) on a powder free non-image area of the light-sensitive organic layer and an average $R_d$ reading is determined from the powder developed area of line and half-tone images. With continuous-tone images the $R_d$ reading is determined on the blackest powder developed area. The reflection density is a measure of the degree of blackness of the developed surface which is relatable to the concentration of particles per unit area. The reflection density of a solid, negative-acting light-sensitive layer ($R_{dn}$) is determined in the same manner except that the negative-acting, light-sensitive layer is exposed to sufficient actinic radiation to convert the exposed area into a powder-receptive area. If the $R_d$ under the conditions of development is between 0.2 (63.1% reflectance) and 2.2 (0.63% reflectance), or preferably between 0.4 (39.8% reflectance) and 2.0 (1.0% reflectance), the solid, light-sensitive organic material deposited in a layer is suitable for use in this invention.

Although the $R_d$ of all light-sensitive layers is determined by using the aforesaid black developing powder and a white substrate, the $R_d$ is only a measure of the suitability of a light-sensitive layer for use in this invention.

Since the $R_d$ of any light-sensitive layer is dependent on numerous factors other than the chemical constitution of the light-sensitive layer, the light-sensitive layer is best defined in terms of its $R_d$ under the development conditions of intended use. The positive-acting, solid, light sensitive organic layers useful in this invention must be (1) powder receptive in the sense that the aforesaid black developing powder can be embedded as a mono-particle layer into a stratum at the surface of the unexposed layer to yield a $R_{dp}$ of 0.2 to 2.2 (0.4 to 2.0 preferably) under the predetermined conditions of development and (2) light-sensitive in the sense that upon exposure to actinic radiation the most exposed areas can be converted into the non-particle receptive state (background cleared) under the predetermined conditions of development. In other words, the positive-acting, light-sensitive layer must contain a certain inherent powder receptivity and light-sensitivity. The positive-acting, light-sensitive layers are apparently converted into the powder-non-receptive state by a light-catalyzed hardening action, such as photopolymerization, photocrosslinking, photooxidation, etc. Some of these photohardening reactions are dependent on the presence of oxygen, such as the photooxidation of internally ethylenically unsaturated acids and esters while others are inhibited by the presence of oxygen, such as those based on the photopolymerization of vinylidene or polyvinylidene monomers alone or together with polymeric materials. The latter require special precautions, such as storage in oxygen-free atmosphere or oxygen-impermeable cover sheets. For this reason, it is preferable to use solid, positive-acting, film-forming, organic materials containing no terminal ethylenic unsaturation.

The negative-acting, solid, light-sensitive organic layers useful in this invention must be light-sensitive in the sense that, upon exposure to actinic radiation, the most exposed areas of the light-sensitive layer are converted from a non-powder-receptive state under the predetermined conditions of development to a powder-receptive state under the predetermined conditions of development. In other words, the negative-acting, light-sensitive layer must have a certain minimum light-sensitivity and potential powder receptivity. The negative-acting, light-sensitive layers are apparently converted into the powder receptive state by a light-catalyzed softening action, such as photodeploymerization.

In general, the positive-acting, solid, light-sensitive layers useful in this invention comprise a film-forming organic material in its naturally occurring or manufactured form or a mixture of said organic material with plasticizers and/or photoactivators for adjusting powder receptivity and sensitivity to actinic radiation. Suitable positive-acting, film-forming organic materials, which are not inhibited by oxygen, include internally ethylenically unsaturated acids, such as abietic acid, rosin acids, partially hydrogenated rosin acids, such as those sold under the name Staybelite resin, etc.; esters of internally ethylenically unsaturated acids, methylol amides of maleated oils such as described in application Ser. No. 643,367, filed June 5, 1967 now Pat. No. 3,471,466, phosphatides of the class described in application Ser. No. 796,841, filed on Feb. 5, 1969 now Pat No. 3,585,031, in the name of Hayes, such as soybean lecithin, partially hydrogenated lecithin, dilinolenyl-alpha-lecithin, etc., partially hydrogenated rosin acid esters, such as those sold under the name Staybelite esters, rosin modified alkyds, etc.; polymers of ethylenically unsaturated monomers, such as vinyltoluene-alpha methyl styrene copolymers, polyvinyl cinnamate, polyethyl methacrylate, vinyl acetate-vinyl stearate copolymers, polyvinyl pyrrolidone, etc.; coal tar resins, such as coumarone-idene resins, etc.; halogenated hydrocarbons, such as chlorinated waxes, chlorinated polyethylene, etc. Positive-acting, light-sensitive materials, which are inhibited by oxygen include mixtures of polymers, such as polyethylene terephthalate/sebacate, or cellulose acetate or acetate/butyrate, with polyunsaturated vinylidene monomers, such as ethylene glycol diacrylate or dimethacrylate, tetraethylene glycol diacrylate or dimethacrylate, etc.

Although numerous positive-acting, film-forming organic materials have the requisite light-sensitivity and powder receptivity at predetermined development temperatures, it is generally preferable to compound the film-forming organic material with photoactivator(s) and/or plasticizer(s) to impart optimum powder receptivity and light-sensitivity to the light-sensitive layer. In most cases, the light-sensitivity of an element can be increased many fold by incorporation of a suitable photoactivator capable of producing free-radicals which catalyze the light-sensitive reaction and reduce the amount of photons necessary to yield the desired physical change. For example, the near ultraviolet light sensitivity of soybean lecithin layers can be increased by a factor of 2,000 by the addition of a small concentration of ferric chloride. Whereas it may take eight minutes to clear the background of a light-sensitive lecithin element devoid of photoactivators using near ultraviolet radiation, lecithin elements containing from about 1–15% by weight ferric chloride based on the weight of the lecithin are so light-sensitive that they must be handled under yellow safety lights much like silver halide emulsions. The ferric chloride-photoactivated lecithin is about 10 times slower than silver halide printing papers but faster than commercial diazo material. Ferric chloride also advantageously increases the toughness and integrity of phosphatide layers.

Other suitable photoactivators capable of producing free-radicals include benzil, benzoin, Michler's ketone, diacetyl, phenanthraquinone, p-dimethylaminobenzoin, 7,8-benzoflavone, trinitrofluorenone, desoxybenzoin, 2,3-pentanedione, dibenzylketone, nitroisatin, di(6-dimethylamino - 3 - pyridyl)methane, metal naphthenates, N-methyl-N-phenylbenzylamine, pyridil, (di-2-pyridil glyoxal) 5 - 7 dichloroisatin, azodiisobutyronitrile, trinitroanisole, chlorophyll, isatin, bromoisatin, etc. These compounds can be used in a concentration of .001 to 2 times the weight of the film-forming organic material (.1%–200% the weight of film former). As in most catalytic systems, the best photoactivator and optimum concentration thereof are dependent upon the film-forming organic material. Some photoactivators respond better with one type of film-former and may be useful over rather narrow concentration ranges whereas others are useful with substantially all film-formers in wide concentration ranges.

The acyloin and vicinal diketone photoactivators, particularly benzil and benzoin are preferred. Benzoin and benzil are effective over wide concentration ranges with substantially all film-forming light-sensitive organic materials. Although slightly inferior to ferric chloride as photoactivators for lecithin, they are capable of increasing the light-sensitivity of the ethanol-insoluble fraction of lecithin to nearly the level of ferric chloride-sensitized lecithin. Benzoin and benzil have the additional advantage that they have a plasticizing or softening effect on film-forming light-sensitive layers, thereby increasing the powder receptivity of the light-sensitive layers. When employed as a photoactivator, benzil should preferably comprise at least 1% by weight of the film-forming organic material (.01 times the film former weight).

Dyes, optical brighteners and light absorbers can be used alone or preferably in conjunction with the aforesaid free-radical producing photoactivators (primary photoactivators) to increase the light-sensitivity of the light-sensitive layers of this invention by converting the light rays into light rays of longer lengths. For convenience, these secondary photoactivators (dyes, optical brighteners and light absorbers) are called "superphotoactivators." Suitable dyes, optical brighteners and light absorbers include 4-methyl - 7 - dimethylaminocoumarin, Calcofluor yellow HEB (preparation described in U.S. Pat. 2,415,373), Calcofluor white SB super 30080, Calcofluor, Uvitex W conc., Uvitex TXS conc., Uvitex RS (described in Textil-Rundschau 8 [1953], 339), Uvitex WGS conc., Uvitex K, Uvitex CF conc., Uvitex W (described in Textil-Rundschau 8 [1953], 340). Aclarat 8678, Blancophor OS, Tenopol UNPL, MDAC S–8844, Uvinul 400, thioflavine TGN conc., aniline yellow—S (low conc.), Setoflavine T 5506–140, Auramine O, Calcozine yellow, OX, Calcofluor RW, Calcofluor GAC, Acetosol yellow 2 RLS-PHF, eosine bluish, Chinaline yellow—P conc., Ceniline yellow S (high conc.), anthracene blue violet fluorescence, Calcofluor white MR, Tenopol PCR, Uvitex GS, acid-yellow-T-supra, Acetosol yellow 5 GLS, Calcocid OR. & Ex. Conc., diphenyl brilliant flavine 7 GFF, Resoform fluorescent yel. 3 GPI, eosine yellowish, Thiazole Fluorescor G, pyrazalone orange YB–3 and National FD&C yellow. Individual superphotoactivators may respond better with one type of light-sensitive organic film-former and photoactivator than with others. Further, some photoactivators function better with certain classes of brighteners, dyes and light absorbers. For the most part, the most advantageous combinations of these materials and proportions can be determined by simple experimentation.

As indicated above, plasticizers can be used to impart optimum powder receptivity to the light-sensitive layer. With the exception of lecithin, most of the film-forming light-sensitive organic materials useful in this invention are not powder-receptive at room temperature but are powder-receptive above room temperature. Accordingly, it is desirable to add sufficient plasticizer to impart room temperature (15 to 30° C.) or ambient temperature powder receptivity to the light-sensitive layers and/or broaden the $R_{dp}$ range of the light-sensitive layers. Plasticizers are particularly useful in continuous tone reproduction systems, where the light-sensitive layer must have a $R_{dp}$ of at least 0.5 and preferably 0.7–2.0. If the $R_{dp}$ is less than 0.5, the developed image lacks the tonal contrast necessary for aesthetically pleasing continuous-tone reproductions.

While various softening agents, such as dimethyl siloxanes, dimethyl phthalate, glycerol, vegetable oils, etc. can be used as plasticizers, benzil and benzoin are preferred since, as pointed out above, these materials have the additional advantage that they increase the light-sensitivity of the film forming organic materials. As plasticizer-photoactivators, benzoin and benzil are preferably used in a concentration of 1% to 80% by weight of the film-forming solid organic material.

The preferred positive-acting, light-sensitive film formers containing no conjugated terminal ethylenic unsaturation include the esters and acids of internally ethylenically unsaturated acids, particularly the phosphatides, rosin acids, partially hydrogenated rosin acids and the partially hydrogenated rosin esters. These materials, when compounded with suitable photoactivators, preferably acyloins or vicinal diketones together with superphotoactivators, or ferric chloride in the case of lecithin, require less than 2 minutes exposure to clear the background of light-sensitive layers and yield excellent continuous tone-reproductions having a $R_{dp}$ of at least 0.5 as well as line image and half-tone reproductions. These light-sensitive film formers and many of the other light-sensitive film formers containing no conjugated ethylenic unsaturation have the additional property that they can be removed after exposure to actinic radiation with a suitable solvent, as explained below.

In general, the negative-acting, light-sensitive layers useful in this invention comprise a film forming organic material in its naturally occurring or manufactured form, or a mixture of said organic material with plasticizers and/or photoactivators for adjusting powder receptivity and sensitivity to actinic radiation. Suitable negative-acting film-forming organic materials include N-benzyl linoleamide, dilinoleyl-alpha-lecithin, castor wax (glycerol 12-hydroxy-stearate), ethylene glycol monohydroxy-stearate, polyisobutylene, polyvinyl stearate, etc. Of these, castor wax and other hydrogenated ricinoleic acid esters (hydroxystearates) are preferred. These materials can be compounded with plasticizers and/or photoactivators in the same manner as the positive-acting, light-sensitive film-forming organic materials.

Surprisingly, some solid light-sensitive organic film formers can be used to prepare either positive or negative-acting, light-sensitive layers. For example, a poly(n-butyl methacrylate) layer containing 20 percent benzoin (20 parts by weight benzoin per 100 parts by weight polymer) yields good positive-acting images. Increasing the benzoin level to 100 percent converts the poly(n-butyl methacrylate) layer into a good negative-acting system.

The light-sensitive layers useful in this invention are formed by applying a thin layer of solid-light-sensitive film-forming organic material having a potential $R_d$ of 0.2 to 2.2 (i.e. capable of developing a $R_{dp}$ or $R_{dn}$ of 0.2 to 2.2) to a suitable substrate (glass, metal, ceramic, paper, plastic, etc.) by any suitable means dictated by the nature of the material (hot-melt draw down, spray, roller coating or air knife, flow, dip or whirler coating from solvent solution, curtain coating, etc.) so as to produce a reasonably smooth homogeneous layer of from about 0.1 to 40 microns thick. The light-sensitive layer must be at least 0.1 micron thick and preferably at least 0.4 micron in order to hold suitable powders during development. If the light-sensitive layer is less than 0.1 micron, or the developing powder diameter is more than 25 times layer thickness, the light-sensitive layer does not hold powder with the tenacity necessary to form a permanent record. In general, as layer thickness increases, the light-sensitive layer is capable of holding larger particles. However, as the light-sensitive layer thickness increases, it becomes increasingly difficult to maintain film integrity during development. Accordingly, the light-sensitive layer must be from 0.1 to 40 microns, preferably from 0.4 to 10 microns, with 0.5 to 2.5 microns being best.

As explained above, the preferred method of applying light-sensitive layers of predetermined thickness to a substrate comprises flow coating a solution in organic solvent vehicle (hydrocarbon, such as hexane, heptane, benzene, etc.; halogenated hydrocarbon, such as chloroform, carbon tetrachloride, 1,1,1-trichloroethane, trichloroethylene, etc.; alcohols, such as ethanol, methanol, propanol, etc.; ketones, such as acetone, methyl ethyl ketone, etc.) of the light-sensitive organic film former alone or together with dissolved or suspended photoactivators and/or plasticizers onto a substrate. The hydrocarbon and halohydrocarbons are excellent solvents for the preferred positive-acting, light-sensitive film formers containing no terminal conjugated ethylenic unsaturation, and are the preferred vehicles because of their high volatility and low cost. Typically, solutions prepared with these vehicles can be applied to a substrate and air dried to a continuous clear film in less than one minute. In general, the halohydrocarbons have the advantages that they are non-flammable and can be used without danger of flash fires. However, many of these, such as chloroform and carbon tetrachloride, must be handled with care due to the toxicity of their vapors. Of all these solvents, 1,1,1-trichloroethane is preferred since it has low toxicity, is non-flammable and low-cost and has high volatility. In general, the thickness of the light-sensitive layer can be varied as a function of the concentration of the solids dissolved in the solvent vehicle.

The substrates for the light-sensitive elements should be smooth and uniform in order to facilitate obtaining a smooth coating. The supports can be opaque, transparent, contain an image of a first color produced by a process other than deformation imaging or one or more images of different colors produced originally by deformation imaging. Suitable substrates include metals, such as steel and aluminum plates, sheets and foils, glass, paper, cellulose esters, such as cellulose acetate, cellulose propionate, cellulose butyrate, etc., polyethylene terephthalate, nylon, polystyrene, polyethylene, corona discharge treated polyethylene, polypropylene, Tedlar PVF (polyvinyl fluoride), polyvinyl alcohol, amylose, etc. In general, it is preferable to apply a subbing layer to paper substrates to slow down the penetration of organic solvent solutions and, other things being equal, to facilitate the formation of thicker light-sensitive layers. If desired, the supports or bases can be subbed with various hydrophobic polymers, such as cellulose acetate, cellulose propionate, cellulose butyrate, polyethylene terephthalate, polystyrene, polyethylene, polypropylene, polyvinyl fluoride, etc. or hydrophilic layers such as polyvinyl alcohol, hardened gelatin, amylose, polyacrylic acid, etc. in order to provide the support or substrates with a surface having specific hydrophilic or hydrophobic properties. As pointed out in our parent applications Ser. Nos. 796,897 and 833,771, the swelling properties of the surface of the substrate can be employed advantageously to permit imbibition of suitable dye color or colors into the surface of the substrate and/or permit molecular dispersion of dye particles within the carrier.

With the preferred light-sensitive film formers containing no conjugated terminal ethylenic unsaturation, which are hydrocarbon and halohydrocarbon soluble, it is preferred to employ substrates having a hydrophilic surface capable of swelling and receiving water-soluble dyes by dye imbibition. Under suitable conditions, each color can be imbibed into the surface of the substrate and subsequent light-sensitive layers can be applied to the surface of the substrate from the hydrocarbon or halohydrocarbon vehicles without disturbing or altering the imagewise configuration of preceding colors. This technique has the additional advantage that each of the colors employed to define the image is present in the same layer thereby providing a more eye-appealing and truer color range. If a water-soluble, light-sensitive film former is employed, a substrate having a hydrophobic surface can be employed as the receiving layer for dye imbibition of oil-soluble dyes. Alternatively, the surface of the substrate can be selected in a manner to preclude dye imbibition as explained in Ser. No. 833,771.

After the substrate is coated with a suitable solid, light-sensitive organic layer, a latent image is formed by exposing the element to actinic radiation in image-receiving manner for a time sufficient to provide a potential $R_d$ of 0.2 to 2.2 (clear the background of the positive-acting, light-sensitive layers or establish a potential $R_{dn}$ of 0.2 to 2.2 with negative-acting, light-sensitive layers). The light-sensitive elements can be exposed to actinic light through a photographic positive or negative, which may be line, half-tone or continuous tone, etc. However, for color proofing work, it is preferable to employ continuous tone or half-tone positive transparencies in order to ascertain the capabilities of plates to be made with the positives and/or the final printed reproduction.

As indicated, the latent images are preferably produced from positive-acting, light-sensitive layers by exposing the element in image-receiving manner for a time sufficient to clear the background, i.e. render the exposed areas non-powder-receptive. As explained below, the amount of actinic radiation necessary to clear the background varies to some extent with developer powder size and development conditions. Due to these variations, it is often desirable to slightly overexpose line and half-tone images in order to assure complete clearing of the background. Slightly more care is necessary in continuous-tone work since overexposure tends to decrease the tonal range of the developed image. In general, overexposure is preferred with negative-acting, light-sensitive elements in order to provide maximum contrast.

After the light-sensitive element is exposed to actinic radiation for a time sufficient to clear the background of a positive-acting, light-sensitive layer or establish a potential $R_{dn}$ of 0.2 to 2.2, a suitable developing powder having a diameter or dimension along one axis of at least 0.3 micron is applied physically with a suitable force, preferably mechanically, to embed the powder in the light-sensitive layer. The developing powder can be virtually any shape, such as spherical, acicular, platelets, etc.

Although the developing powder can be a pigment or dye of suitable size (0.3 micron or larger), it is preferable to employ solid materials as carriers for pigments or dyes, since most pigments or dyes are not available in the required size range for use in this invention. The colorants (pigments or dyes) can be ball-milled with carrier in order to coat the carrier with pigment or dye or, if desired, pigments or dyes can be blended above the melting point of fusible or resinous carriers, ground to a suitable size and classified. In some cases, it is advantageous to dissolve dye and carrier in a mutual solvent, dry and grind to suitable size. Usually the developing powder contains from about 0.1 to 50% by weight colorant (dye and/or pigment) and correspondingly 99.9 to 50% by weight carrier. The black developing powder for determining the $R_d$ of a light-sensitive layer is formed by heating about 77% Pliolite VTL (vinyltoluenebutadiene copolymer) and 23% Neo Spectra carbon black at a temperature above the melting point of the resinous carrier, blending on a rubber mill for fifteen minutes and then grinding in a Mikro-atomizer. Commercially available powders such as Xerox 914 Toner give substantially similar results although tending towards slightly lower $R_d$ values.

Suitable carriers for the colorants include hydrophilic polymeric carriers, such as polyvinyl alcohol, granular starches (preferably corn or rice), animal glue, gelatin, gum arabic, gum tragacanth, carboxypolymethylene, polyvinyl pyrrolidone, carbowaxes, etc.; hydrophilic monomeric materials, such as sorbitol, mannitol, dextrose, tartaric acid, urea, etc., hydrophobic carriers, such as polystyrene, Pliolite VTL (butadiene-styrene copolymer), polymethyl methacrylate, etc.

Suitable colorants include the typical insoluble pigments, such as Paliofast blue, Watchung red B, Chromophtal Yellow, etc.; water-soluble dyes, such as Alphazurine 2G, Calcocid Phloxine 2G, tartrazine, acid chrome blue 3BA conc., acid magenta O., Ex. Conc., acid violet 10BN, Calcocid Rubine XX Conc., Carmoisine BA Ex. Conc., Neptune blue BRA conc., Nigrosine Jet Conc., Patent blue AF, Ex. Conc., Pontacyl light red 4 BL Conc. 175%, etc., oil soluble dyes, such as oil blue ZV, oil red N–1700, etc.

Although either dyes or pigments can be employed as the colorant component of the developing powders of this invention, dyes are preferred since they can be molecularly dispersed into suitable carriers or imbibed and molecularly dispersed into the substrate of suitable substrates. As pointed out in our copending applications Ser. Nos. 796,897 and 833,771, molecular dispersion changes dye images from a pale color to a brilliant saturated more pleasing hue. Dye imbibition has the additional advantage that each of the colorants employed to define the image can be imbibed into the same receiving layer providing a more eye-appealing and truer color range.

Since the multicolor reproductions of this invention are preferably produced by dye imbibition, and the preferred light-sensitive film formers containing no terminal conjugated ethylenic unsaturation are preferably deposited from a hydrocarbon or halohydrocarbon vehicle, it is preferable to employ a colorant containing a water soluble dye in conjunction with a substrate bearing a hydrophilic receiving surface. The water soluble dye can be employed advantageously with hydrophilic polymeric carriers, hydrophilic monomeric carriers, hydrophobic polymeric carriers, etc. The hydrophobic carriers, particularly those soluble in hydrocarbon and halohydrocarbon, have the advantage that they can be removed at a later stage in the processing with a suitable solvent, as explained below and in our copending application Ser. No. 849,520, filed Aug. 12, 1969, now abandoned. Further, dye-imbibition images produced with hydrophobic carriers tend to be glossy. On the other hand, the hydrophilic carriers tend to adhere to or imbibe into the surface of the hydrophilic substrate during the dye imbibition step, leading to a somewhat matte finish. Accordingly, the particular carrier employed can be varied to obtain either a glossy or matte finish. Likewise, oil soluble dyes can be used with hydrophilic polymeric carriers, hydrophilic monomeric carriers, hydrophobic polymeric carriers, etc. and imbibed into the surface of substrates having a suitable surface, which is oil swellable, hydrocarbon swellable, halohydrocarbon swellable, etc.

If desired, the dye can be molecularly dispersed in the carrier and not imbibed into the surface of the substrate. In this technique, the carrier and dye must be selected in a manner such that the dye is soluble in the material whose vapors act as a swelling agent for the solid carrier. For example, water soluble dyes are preferably used with hydrophilic polymeric carriers such as polyvinyl alcohol, granular, starches, animal glue, gelatin, gum arabic, gum tragacanth, carboxypolymethylene, polyvinyl pyrrolidone, etc. and hydrophilic monomeric materials such as sorbitol, mannitol, dextrose, etc. Although many of these carriers are normally thought of as being water soluble, these carriers only swell and absorb the water soluble dye as it molecularly disperses in or on the carrier under the conditions of treatment with water vapor or steam. Simultaneously the carrier adheres to the surface of hydrophobic substrate. Oil soluble, hydrocarbon soluble and halohydrocarbon soluble dyes can be used with carriers such as polyvinyl pyrrolidone, polystyrene, Pliolite VTL, polymethyl methacrylate, etc. For example, a 1,1,1-trichloroethane soluble dye and a polyvinyl pyrrolidone carrier can be deposited upon a gelatin coated paper substrate and the particulate dye molecularly dispersed in the polyvinyl pyrrolidone carrier by treatment with 1,1,1-trichloroethane vapors.

The developing powders useful in this invention contain particles having a diameter or dimension along at least one axis from 0.3 to 40 microns, preferably from 0.5 to 15 microns with powders of the order of 1 to 7 microns being best for light-sensitive layers of 0.4 to 10 microns. Maximum particle size is dependent on the thickness of light-sensitive layer while minimum particle size is independent of layer thickness. Electron miscroscope studies have shown that developing powders having a diameter 25 times the thickness of the light-sensitive layer cannot be permanently embedded into light-sensitive layers and, generally speaking, best results are obtained where the diameter of the powder particle is less than about 10 times the thickness of the light-sensitive layer. For the most part, particles over 40 microns are not detrimental to image development provided the developing powder contains a reasonable concentration of powder particles under 40 microns, which are less than 25 times, and preferably less than 10 times, the light-sensitive layer thickness. However, other things being equal, the larger the developer powder particles (above 10 microns), the lower the $R_d$ of the developed image. For example, when Xerox 914 Toner, classified to contain (a) all particles under 1 microns, (b) 1 to 3 micron particles, (c) 3 to 10 micron particles, (d) 10 to 18 microns and (e) all particles over 18 microns, was used to develop positive-acting 1 micron thick lecithin light-sensitive elements after the same exposure, the images had a $R_{dp}$ of (a) 0.83, (b) 0.95, (c) 0.97, (d) 0.32, and (e) 0.24, respectively.

Although particles over 40 microns are not detrimental to image development, the presence of particles under 0.3 micron diameter along all axes can be detrimental to proper image formation. In general, it is preferably to employ developing powders having substantially all powders having a diameter along at least one axis not less than 0.3 micron, preferably more than 0.5 micron, since particles less than 0.3 micron tend to embed in non-image areas.

As the particle size of the smallest particles increases, less exposure to actinic radiation is required to clear the background. For example, when Xerox 914 Toner, classified to contain (a) all particles under 1 micron, (b) 1 to 3 micron particles, (c) 3 to 10 micron particles, (d) 10 to 18 micron particles and (e) over 18 micron particles, was used to develop the light-exposed portions of postive-acting 1 micron thick lecithin light-sensitive elements, the exposed portions had a $R_{dp}$ of (a) 0.26, (b) 0.23, (c) 0.10, (d) 0 and (e) 0 after equal exposures. By suitably increasing the exposure time, the $R_{dp}$ of the non-image areas was reduced to substantially zero with particles (a), (b) and (c).

In general, somewhat more deposition of powder particles into non-image areas can be tolerated when using a black developing powder than a colored powder since the human eye is less offended by gray background or non-image areas than by the deposition of colored particles in non-image areas. Therefore, the concentration of particles under 0.3 micron and the size of the developing powder is more critical when using a colored powder such as cyan, magenta or yellow. For best results, the developing powder should have substantially all particles (at least 95% by weight) over 1 micron in diameter along one axis and preferably from 1 to 7 microns for use with light-sensitive layers of from 0.4 to 10 microns. In this way, powder embedment in image areas is maximum and relatively little powder is embedded into non-image areas. Accordingly, rice starch granules, which are 5 to 6 microns, are particularly useful as carrier for dyes of different hues.

In somewhat greater detail, the developing powder is applied directly to the light-sensitive layer, while the powder receptive areas of said layer are in at most only a slightly soft deformable condition and said layer is at a temperature below the melting point of the layer and powder. The powder is distributed over the area to be developed and physically embedded into the stratum at the surface of the light-sensitive layer, preferably mechanically by force having a lateral component, such as to-and-fro and/or circular rubbing or scrubbing action using a soft pad, fine brush or even an inflated balloon. If desired, the powder may be applied separately or contained in the pad or brush. The quantity of powder is not critical provided there is an excess available beyond that required for full development of the area, as the development seems to depend primarily on particle-to-particle interaction rather than brush-to-surface or pad-to-surface forces to embed a layer of powder particles substantially one particle thick (monoparticle layer) into a stratum at the surface of the light-sensitive layer. When viewed under an inverse microscope, spherical powder particles under about 10 microns in diameter enter the powder-receptive areas first and stop dead, embedded substantially as a monolayer. The larger particles seem to travel over the embedded smaller particles which do not rotate or move as a pad or brush is moved back and forth over the developed area. Non-spherical particles, such as platelets, develop like the spherical powders except that the flat side tends to embed. Only a single stratum of power particles penetates into the powder-receptive areas of the light-sensitive layer even if the light-sensitive layer is several times thicker than the developer particle diameter.

The minimum amount of powder of the preferred type required to develop an area to its maximum density is about 0.01 gram per square inch of light-sensitive surface. Ten to 20 or more times this minimum range can be used with substantially the same results, a useful range being about 0.02 to 0.2 gram per square inch.

The pad or brush used for development is critical only to the extent that it should not be so stiff as to scratch or scar the film surface when used with moderate pressure with the preferred amount of powder to develop the film. Ordinary absorbent cotton loosely compressed into a pad about the size of a baseball and weighing about 3 to 6 grams is especially suitable. The developing motion and force applied to the pad during development is not critical. A force as low as a few grams applied to the pad when using the preferred amount of powder will develop an area of the film to essentially maximum density, although a suitable material could withstand a developing force of 300 grams with substantially the same density resulting in both instances. A force of 10 to 100 grams is preferred to assure uniformity of results. The speed of the swabbing action is not critical other than that it affects the time required; rapid movement requiring less time than slow. The preferred mechanical action involved is essentially the lateral action applied in ultrafine finishing of a wood surface by hand sanding or steel wooling.

Hand swabbing is entirely satisfactory, and when performed under the conditions described above, will reproducibly produce the maximum density which the material is capable of achieving. That is, the maximum concentration of particles per unit area will be deposited under the prescribed conditions, dependent upon the physical properties of the material such as softness, resiliency, plasticity, and cohesiveness. Substantially the same results can be achieved using a mechanical device for the powder application. A rotating, or rotating and oscillating, cylindrical brush or pad may be used to provide the described brushing action and will produce a substantially similar end result.

After the powder application, excess powder remains on the surface which has not been sufficiently embedded into, or attached to, the film. This may be removed in any convenient way, as by wiping with a clean pad or brush usually using somewhat more force than employed in mechanical development, by vacuum, by vibrating, or by air doctoring. For simplicity and uniformity of results, the excess powder usually is blown off using an air gun having an air-line pressure of about 20 to 40 p.s.i. The gun is preferably held at an angle of about 30 to 60 degrees to the surface at a distance of 1 to 12 inches (3 to 8 preferred). The pressure at which the air impinges on the surface is about 0.1 to 3, and preferably about 0.25 to 2, pounds per square inch. Air cleaning may be applied for several seconds or more until no additional loosely held particles are removed. The remaining powder should be sufficiently adherent to resist removal by moderately forceful wiping or other reasonable abrasive action. If a fusible or resinous carrier is used in the formulation of the developing powder, scuff resistance can be improved after removing excess powder by brief (2 to 5 seconds) exposure of the specimen to heat or to solvent vapors to fuse the carrier.

Under some circumstances, it is possible to develop an image without applying mechanical force, such as by using air pressure or cascade-development techniques, which use large carrier beads as a driving force. However, the image is usually imperfect in the sense that it has lower contrast and the image areas lack uniformity or proper tonal values, when compared to images developed using the prescribed mechanical force. For example, when a light-sensitive Staybelite resin element, capable of yielding a $R_{dp}$ of 1.9 with the aforementioned preferred black toner (77% Pliolite VTL–23% Neo Spectra carbon black) at room temperature using mechanical force, was dusted at room temperature with the preferred black toner and subjected to air pressure (a non-mechanical, physical force), such as that normally used to remove excess powder particles from non-image areas, a non-uniform image was obtained having a maximum $R_{dp}$ of 0.67. The non-uniform image was similar to images developed with insufficient developer using mechanical force. When the non-uniform air-developed element was gently swabbed with a clean cotton pad, image uniformity improved somewhat. When the same light-sensitive Staybelite resin element, capable of yielding a $R_{dp}$ of 0.99 with Xerox 914 Toner at room temperature using mechanical force, was developed by cascade development at room temperature using Xerox 914 Toner with large carrier beads as a driving force, air cleaned and wiped with a cotton pad, an image having a $R_{dp}$ of 0.66 was obtained. Although this image lacked the excellent resolution and uniformity of images developed using mechanical force, it had substantially better image qualities than images developed using air pressure alone or air pressure followed by gentle wiping. While air pressure or cascade development have been used with some success with light-sensitive Staybelite resin elements, not all light-sensitive elements of this invention can be developed in this manner. Attempts to develop light-sensitive lecithin elements using air pressure or cascade development at room temperature have generally resulted in images having a $R_{dp}$ of less than 0.2.

The reflection density, and the $R_{dp}$ in particular, of a light-sensitive layer is also dependent upon the temperature of the light-sensitive layer during physical embedment. In general, the higher the temperature of the light-sensitive layer, the higher the $R_{dp}$ of the developed image. For example, Staybelite Ester No. 10 alone, which is incapable of forming an image having a $R_{dp}$ of at least 0.2 from 0–130° F. can be developed to a $R_{dp}$ of about 0.2 at 135° F. and about 0.6 at 165° F. Similarly, soybean lecithin, in its naturally occurring form, which readily develops a $R_{dp}$ of about 0.7 to 0.9 with a suitable developer at room temperature, yields a $R_{dp}$ of less than 0.2 at 0° F.

To some extent, reproducibility of results and length of exposure are also dependent upon the relative humidity of the development chamber or area. For development at higher relative humidity, sensitized-lecithin elements must be exposed to more actinic radiation to clear the background. For example, other things being equal, an exposed lecithin element, which is non-powder-receptive at 38% R.H. (relative humidity) has a background $R_d$ of 0.16 at 48% R.H., 0.38 at 56% R.H. and 0.61 at 65% R.H. On the other hand, rosin derivatives, such as Staybelite Ester No. 10, are much less sensitive to relative humidity.

As explained above powder particles comprising a dye, held in image-wise configuration in particulate form in or on a substrate, can be contacted with vapors of a material which is a solvent for said dye and capable of swelling the substrate thereby molecularly imbibing said dye into said substrate. The process of molecularly imbibing the particulate dye into the substrate converts the dye particles in particulate form into a molecularly dispersed form providing an aesthetically, more pleasing saturated image. Other things being equal, the particulate dye image changes from a pale color to a brilliant, saturated, more pleasing hue. In a typical situation, substrates bearing a hydrophilic subbing layer, such as hardened gelatin, polyvinyl alcohol, polyvinyl pyrrolidone, polyacrylic acid, and amylose, can be employed as dye imbibition receiving layers. In this modification a suitable solid, positive-acting or negative-acting light-sensitive layer is applied to the hydrophilic subbing layer, exposed to actinic radiation in image-receiving manner to form a latent image in the manner described above and developed with developer particles of at least 0.3 micron along at least one axis containing a hydrophilic dye. At this point, the dye component of the powder particles is separated from the hydrophilic subbing layer by the light-sensitive layer which may be considered as an additional subbing layer. An aesthetically more pleasing image is then produced by treating the developed image with vapors of a material which is a solvent for the dye and is capable of swelling the surface of the substrate, thereby imbibing the dye in the surface of the substrate in molecularly dispersed form. For example, if the dye is water-soluble, it can be transferred to the subbing layer by water vapor, aqueous alcohol, etc. Essentially the same results can be obtained using a hydrophobic subbing layer, such as polystyrene or polyvinylidene chloride, a hydrophobic dye and suitable solvent vapors.

The particular solvent employed in the dye imbibition step is also dependent on the physical properties of the exposed light-sensitive layer. Although the transportation of the dye through the solid, organic layer is not completely understood, it is believed that in most cases dye imbibition is due to the weakening of the light-sensitive layer by the powder particles employed during deformation imaging creating potential points of stress in the film surface. Subsequently, when solvent vapors, capable of swelling the surface of the substrate (dye imbibition receiving layer) upon which the stressed film is disposed, swell the surface of the substrate, a second stress is placed upon the light-sensitive layer due to the swelling of the receiving layer with the result that the light-sensitive layer fractures and the dye is transported through the light-sensitive layer and imbibed into the surface of the substrate. In other cases dye imbibition may be due to the solvent vapors diffusing the dissolved dye into the light-sensitive layer. In any event, the solvent must be capable of transporting the dye through the original light-sensitive layer.

Experiments have shown that the development of various light-sensitive elements, such as Staybelite Ester #10 and Staybelite resin, with developing powder weakens the film layer. For example, when these light-sensitive elements are developed with undyed developing powder, it is possible to imbibe water soluble dye into the receiving layer in image-wise configuration by merely dipping the developed light-sensitive element into an aqueous dye bath. In such case the water soluble dye enters the hydrophilic receiving layer in the areas defined by the undyed powder particles. Accordingly, in such case, it is clear that transportation of the dye through the light-sensitive layer is at least partially due to weakening of the light-sensitive layer by developer particle.

It has also been found that the above light-sensitive materials have a tendency to puddle up in the exposed areas in image-wise configuration when merely exposed to light and treated with water vapors. Accordingly, dye imbibition of water soluble dyes through these materials is also partially due to the ability of moist warm air to disrupt the unexposed areas of the light-sensitive layer. In other cases, such as in the case of phosphatide light-sensitive elements, the exposed areas of the light-sensitive layer are converted into a more water soluble condition than the unexposed areas as explained in copending application, Ser. No. 796,841 of Hayes, filed Feb. 5, 1969. In such case, water vapor tends to transport the dye image through the exposed areas of the light-sensitive element with the result that the original positive powder image changes into a negative dye imbibition image. In still other cases, it has been possible to prevent passage of water soluble dye into the dye imbibition receiving layer by adding various hydrophobic agents, such as silicone oils in a concentration of 200 parts per million to various light-sensitive layers, such as those based on Staybelite resins and esters. The silicone tends to act as a waterproofing agent in this environment, and no dye imbibition with water vapor is possible since water vapor is incapable of transporting the dye through the light-sensitive layer. Dye imbibition of water soluble dye through light-sensitive layers based on poly(n-butyl methacrylate) and other high molecular weight hydrophobic polymers, is relatively difficult due to the extreme hydrophobic nature of these film formers. Accordingly, routine experimentation may be carried out to determine which solvents are best for transporting specific dyes through particular light-sensitive elements.

Alternatively, powder particles comprising a carrier and a dye, held in image-wise configuration in particulate form in or on a substrate, can be contacted with vapors of a material which is a solvent for said dye, which is capable of swelling said carrier and which is incapable of swelling the surface of said substrate, molecularly dispersing the dye in said carrier, thereby increasing the saturation of the dye image. In this process, the solvent vapors dissolve and molecularly disperse the dye particles on or within the surface of the carrier. The carrier absorbs the molecularly dispersed dye and simultaneously fuses to the substrate forming an adherent layer.

As explained in our copending application Ser. No. 849,520, filed on Aug. 12, 1969 (now abandoned), which is incorporated by reference, certain light-sensitive organic layers (preferably containing no conjugated terminal ethylenic unsaturation) can be removed from the surface of dye-imbibition images using a material which is a solvent for the light-sensitive layer and a poor solvent for the surface of the substrate. Removal of the light-sensitive layer after dye imbibition improves the handling properties of the developed image and enhances the brilliance of the developed image to some extent. Removal of this layer also facilitates recoating of the imaged substrate, giving rise to a more uniform light-sensitive layer without the minute hills and valleys associated with the normal embedded and/or fused images.

As explained above, there are at least three different mechanisms by which images produced in accordance with the principles of this invention can be held in or on the surface of a substrate. First, the deformation images initially produced are held on the surface of the substrate by the solid, originally light-sensitive organic layer. Second, if the power particles contain a fusible carrier, the powder particles can be fused to the substrate by heat and/or suitable solvent vapors. Third, if the powder particles comprise a dye, the dye can be imbibed into the surface of the substrate with vapors of a material which is a solvent for the dye and capable of swelling the surface of the substrate. Accordingly, each color can be held in or on the surface of the substrate by at least three different mechanisms.

As indicated above, the parameters controlling the choice of liquid vehicle for depositing a second or subsequent light-sensitive organic layer directly onto an imaged substrate are dependent upon how the previous color or colors is held in or on the substrate. If the powder particles are embedded in the originally light-sensitive organic layer (held on the surface of the substrate by the solid, originally light-sensitive organic layer) and the second solid light-sensitive organic layer is applied directly to the substrate, the liquid vehicle should be a relatively poor solvent for the components of the embedded image (original light-sensitive organic layer, colorant and carrier for the colorant, if present) in order to avoid impairment of the image-wise configuration of the previously deposited color. For example, powder particles embedded into a lecithin layer tend to lose their image-wise configuration when a second light-sensitive layer is applied from a hydrocarbon or halohydrocarbon vehicle.

If the originally embedded powder particles are fused to the substrate, the second solid light-sensitive layer can be applied directly to the substrate from a liquid vehicle which is a relatively poor solvent for the components of the fused powder particles without impairment of the image-wise configuration of the first color. However, the vehicle does not have to be a poor solvent for the orginally light-sensitive organic layer, since the image is no longer held on the substrate by embedment. For example, polyvinyl alcohol-pigment particles embedded into a lecithin light-sensitive layer can be fused to the substrate for the lecithin layer with steam or water vapor. A second light-sensitive lecithin layer can be applied directly to the substrate from a hydrocarbon or halohydrocarbon vehicle without any impairment of the image-wise configuration of the polyvinyl alcohol-pigment image. On the other hand, if the powder particles are composed of Pliolite VTL-pigment and fused to the substrate with heat or trichloroethylene, the reproduction tends to smear when a second light-sensitive layer is applied from a hydrocarbon or halohydrocarbon vehicle. This is due to the fact that these vehicles are good solvents for the fused polymer.

If the colorant components (dye or dyes) of the originally embedded powder particles are imbibed into the surface of the substrate, the second solid light-sensitive organic layer can be applied directly to the substrate from a liquid vehicle which is a relatively poor solvent for the surface of the substrate without impairment of the image-wise configuration of the first color. The vehicle does not have to be a poor solvent for the originally light-sensitive layer or carrier for the colorant since the image is no longer held on the substrate by embedment or fusion.

For example, polyvinyl alcohol-water-soluble dye particles embedded into a lecithin light-sensitive layer can be treated with steam or water vapor to imbibe the water-soluble dye into substrates having a water-swellable surface. A second light-sensitive lecithin layer can be applied directly to the substrate from a hydrocarbon or halohydrocarbon vehicle without any impairment of the dye-imbibition image. If the polyvinyl alcohol carrier is replaced with a water-inert, hydrocarbon- or halohydrocarbon-soluble carrier, such as Pliolite VTL, essentially the same results are obtained. However, water-inert carriers form glossy reproductions while water-swellable carriers form matte reproductions.

The various limitations on the liquid vehicles can be reduced or eliminated by changing the solubility characteristics of the image or by applying a suitable isolating layer. For example, the solubility characteristics of the image can be altered by treating the substrate with polyfunctional compounds known to interact with the originally light-sensitive organic layer or components of the powder particles, if the powder particles are held by embedment. As indicated above, suitable polyfunctional components include polyvalent metal salts, dimethylol urea, urea formaldehyde resins, melamine formaldehyde resin, etc. Optionally, if the light-sensitive organic layer or carrier for the colorant is a tannable colloid, dichromate can be applied to the substrate and the layer tanned to an infusible form with uniform actinic radiation. In other cases where neither the original light-sensitive organic layer or carrier for the colorant is tannable, the substrate can be coated with a dichromated colloid, diazo resin, etc. and exposed to light to form an infusible layer. In other cases, particularly where a hydrocarbon- or halohydrocarbon-soluble light-sensitive, organic layer is employed, a hydrophilic isolating layer such as a solution of polyvinyl alcohol can be applied as a wash coat prior to the application of the second light-sensitive organic sensitizer. The hydrophilic isolating layer can then be employed as the receiving layer for subsequent dye imbibition images.

After the second light-sensitive organic layer is applied to the imaged substrate, it can be exposed to actinic light and developed in the manner described above with a suitable developing powder. After the particles of the second color are embedded into the light-sensitive layer, the powder particles can be fused to the substrate or imbibed therein. While it is preferable to imbibe each of the images into the surface of the substrate, this invention contemplates the formation of pigmented embedment images on top of a fused or imbibed image, etc.

and the formation of dye imbibition images or fused images on top of a pigmented image. In other words, the image of each color can be held in or on the surface of the substrate by a different mechanism.

The preferred method of forming three and four-color reproductions comprises coating a substrate having a hydrophilic surface with a hydrocarbon or halohydrocarbon solution of a light-sensitive organic film former containing no conjugated or terminal ethylenic unsaturation to form a light-sensitive organic layer of from about 0.5 to 2.5 microns capable of developing an $R_d$ of 0.4 to 2.0; exposing said light-sensitive organic layer to actinic radiation in image-receiving manner to establish a potential $R_d$ of 0.4 to 2.0; applying to said layer of organic material, free-flowing powder particles comprising a water-soluble dye and carrier, said powder particles having a diameter along at least one axis of at least one micron; while the element is at a temperature below the melting points of the powder and of the light-sensitive organic layer, physically embedding said powder particles as a monolayer in a stratum at the surface of said light-sensitive layer to yield an image having portions varying in density in proportion to the exposure of each portion; removing non-embedded particles from said organic layer to develop an image; molecularly imbibing water-soluble dye into the hydrophilic substrate by contacting the particles embedded in said organic layer with vapors of water or steam; removing said light-sensitive, organic film former containing no conjugated or terminal ethylenic unsaturation with a hydrocarbon or halohydrocarbon solvent; coating the substrate bearing the first color in image-wise configuration in or on the surface of said substrate with a second solid, light-sensitive organic film former containing no conjugated or terminal ethylenic unsaturation, from a hydrocarbon or halohydrocarbon vehicle to form a light-sensitive organic layer of from about 0.5 to 2.5 microns capable of developing an $R_d$ of 0.4 to 2.0; exposing said light-sensitive organic layer to actinic radiation in image-receiving manner to establish a potential $R_d$ of 0.2 to 2.0; applying to said layer of organic material, free flowing powder particles comprising a second water-soluble dye and carrier, said powder particles having a diameter along at least one axis of at least one micron; while the layer is at a temperature below the melting points of the powder and of the organic layer, physically embedding said powder particles as a monolayer in a stratum at the surface of said light-sensitive layer to yield an image having portions varying in density in proportion to the exposure of each portion; removing non-embedded particles from said organic layer to develop a two-color reproduction; molecularly imbibing water-soluble dye into the hydrophilic substrate by contacting the particles embedded in said organic layer with vapors of water or steam; removing said second light-sensitive layer with a hydrocarbon or halohydrocarbon solvent and repeating the process to form a third image and fourth image, if desired. Normally in three-color work the transparencies are positives corresponding to the cyan, yellow and magenta separation transparencies. In four-color work an additional black separation transparency is employed.

The following examples are merely illustrative and should not be construed as limiting the scope of our invention.

EXAMPLE I

This example illustrates the preparation of a four-color reproduction utilizing four-color half-tone separation positive transparencies.

Sixty-four hundredths of a gram of Staybelite Ester No. 10 (partially hydrogenated rosin ester of glycerol), .16 gram benzil and .096 gram 4-methyl-7-dimethylaminocoumarin, dissolved in 100 mls. Chlorothene (1,1,1-trichloroethane) was applied to the gelatin side of a hardened-gelatin-coated paper by flow coating the solution over the substrate supported at about a 60° angle with the horizontal. After air drying for approximately one minute, the light-sesnsitive layer was approximately one micron thick. The light-sensitive element was placed in a vacuum frame in contact with the yellow separation positive transparency and exposed to a mercury point light source for about 60 seconds. The light-sensitive element was removed from the vacuum frame and developed in a room maintained at 75° F. and 50% relative humidity by rubbing a cotton pad containing Tartrazine-Pliolite VTL (yellow) developing powder of from about 1 to 40 microns diameter along the largest axis, prepared in the manner described below, across the element. The yellow developing powder was embedded into the unexposed areas of the light-sensitive layer by rubbing the loosely compressed absorbent cotton pad about the size of a baseball, weighing about 3 to 6 grams, back and forth over the light-sensitive layer using essentially the same force used in ultrafine finishing of wood surfaces by sanding or steel wooling. The excess powder was removed from the light-sensitive layer by impinging air at an angle of about 30° to the surface until the surface was substantially free of particles. The reproduction was wiped with a fresh cotton pad, resulting in an excellent half-tone reproduction of the positive transparency. The scanning electron microscope showed that a monolayer of particles was embedded in the image areas. The developed image was placed over a beaker of boiling water for about 15 seconds, during which time a pale yellow dye image was imbibed and molecularly dispersed in image-wise configuration into the hardened gelatin layer. The molecularly dispersed image changed from a pale yellow to a brilliant, saturated, aesthetically more pleasing yellow hue. The light-sensitive layer was then washed with Chlorothene by flushing the substrate held at about a 60° angle with the horizontal. After the washed image dried, the scanning electron microscope showed that there was no residual Pliolite VTL developing powder or Staybelite ester on the gelatin surface of the substrate.

Sixty-four hundredths grams Staybelite Ester No. 10, .16 gram benzil and .096 gram 4-methyl-7-dimethylaminocoumarin, dissolved in 100 mls. Chlorothene (1,1,1-trichloroethane) was applied to the yellow-imaged sheet described in the preceding paragraph by flow coating the solution over the substrate supported at about a 60° angle with the horizontal. After air drying, the light-sensitive element was placed in a vacuum frame in contact and in register with the magenta half-tone positive transparency and exposed to a carbon arc for about 60 seconds. The light-sensitive element was developed with Calcocid Phloxine 2G-Pliolite VTL (magenta) developing powder of from about 1 to 40 microns diameter along the largest axis (prepared in the manner described below). The excess developing powder was removed from the light-sensitive layer by impinging air and wiped with a fresh cotton pad. The developed image was placed over a beaker of boiling water for about 15 seconds, during which time the pale magenta dye image was imbibed and molecularly dispersed in image-wise configuration into the hardened gelatin layer. The molecularly dispersed image changed from a pale magenta to a brilliant, saturated, aesthetically more pleasing magenta hue. The developed reproduction was then washed with Chlorothene by flushing the substrate held at about a 60° angle with the horizontal. Initially the liquid flowing down the sheet had a magenta hue due to the liberation of non-imbibed dye particles from the Pliolite VTL carrier. Flushing was continued until the liquid contained no residual magenta color. After the dye imbibition image dried, the scanning electron microscope showed that there was no residual Pliolite VTL powder or Staybelite ester.

The yellow/magenta-image sheet was coated with the same sensitizing solution used to prepare the first two colors, air dried, placed in register with the half-tone cyan separation positive and exposed to light in the manner described above. The light-sensitive element was developed with a Neptune blue-Pliolite VTL (cyan) developing powder of from about 1 to 40 microns in the manner described above. After the excess developing powder was removed the element was placed over a beaker of boiling water for about 15 seconds, during which time the pale blue dye image was imbibed and molecularly dispersed in image-wise configuration into the hardened gelatin layer. The molecularly dispersed image changed from a pale blue to a brilliant, saturated, aesthetically more pleasing cyan hue. The light-sensitive layer was then washed with Chlorothene by flushing the substrate held at about a 60° angle with the horizontal until the liquid contained no residual cyan color. After the dye imbibition image dried, the scanning electron microscope showed that there was no residual Pliolite VTL developing powder or Staybelite ester. The developed three-color image was an excellent copy of the silver halide color original from which the half-tone color separation positives were made except that the deep shadow areas were somewhat weak.

The three-color sheet was flow coated with the same light-sensitive Staybelite ester composition used to prepare the first three colors, air dried, placed in register with the half-tone black separation positive transparency and exposed to a carbon arc for about 60 seconds. The light-sensitive element was developed with a Nigrosine WS-Pliolite VTL (black) developing powder of from about 1 to 40 microns diameter along the largest axis in the manner described above. After the excess powder was removed from the light-sensitive layer, the developed image was placed over a beaker of boiling water for about 15 seconds, during which time the black dye was imbibed and molecularly dispersed in image-wise configuration into the hardened gelatin layer. The light-sensitive layer was then washed with Chlorothene by flushing the substrate held at about a 60° angle with the horizontal. After the element dried, the scanning electron microscope showed that there was no residual Pliolite VTL developing powder or Staybelite resin. The resulting full-color reproduction simulated the silver halide color original from which the color separation positive transparencies were made.

The developing powders employed in this example were prepared by milling the indicated number of grams of micronized Pliolite VTL and dye on a ball mill with porcelain balls for 12 hours: (1) 188 grams Pliolite VTL and 12 grams Tartrazine; (2) 194 grams Pliolite VTL and 6 grams Calcocid Phloxine 2G; (3) 194 grams Pliolite VTL and 6 grams Neptune blue; and (4) 176 grams Pliolite VTL and 24 grams Nigrosine WS.

A faithful continuous-tone reproduction was prepared in the same manner by employing continuous-tone separation positives in place of the half-tone separation positives.

Essentially the same results are obtained by replacing each of the light-sensitive Staybelite Ester No. 10 compositions (partially hydrogenated rosin ester of glycerol) with (a) 1.25 grams Staybelite Ester No. 5 (partially hydrogenated rosin ester of glycerol), .1875 gram benzil and .3125 gram 4-methyl-7-dimethylaminocoumarin dissolved in 100 mls. Chlorothene, (b) 1.25 grams Staybelite resin F (partially hydrogenated rosin acids), .1 gram benzil and .3125 gram 4-methyl-7-dimethylaminocoumarin dissolved in 100 mls. Chlorothene, (c) 1.25 grams wood rosin, .15 gram benzil and .3125 gram 4-methyl-7-dimethylaminocoumarin dissolved in 100 mls. Chlorothene, (d) 1.25 grams abietic acid, .15 gram benzil and .3125 gram 4-methyl-7-dimethylaminocoumarin dissolved in 100 mls. Chlorothene and (e) 1.25 grams Chlorowax 70 LMP, .3 gram benzil and .3125 gram 4-methyl-7-dimethylaminocoumarin dissolved in 100 mls. Chlorothene.

EXAMPLE II

Example I was repeated except that the Nigrosine-Pliolite VTL developing powder was replaced with a pigmented black powder composed of 77 parts by weight Pliolite VTL and 23 parts by weight Neo Spectra carbon black prepared in the manner described in the body of the specification. After the non-embedded black developing powder was removed from the substrate, the reproduction was placed in a chamber containing trichloroethylene vapors maintained at room temperature for about 5 seconds to fuse the black powder particles to the gelatin subbing layer. The four-color reproduction was comparable to the four-color half-tone reproduction prepared in Example I.

EXAMPLE III

This example illustrates the preparation of a four-color reproduction utilizing lecithin as the light-sensitive layer and pigmented developing powders.

Five grams of unfractionated, substantially oil-free soybean lecithin and .5 gram ferric chloride in 100 mls. of Chlorothene was dispersed by an ultrasonic tool for a minute, filtered through Celite Supercel, flow coated over Lusterkote paper and air dried to form a 1.5 micron light-sensitive layer. The light-sensitive element was placed in a vacuum frame in contact with the cyan continuous tone separation transparency, exposed to a carbon arc for about 30 seconds, and developed in a room maintained at 75° F. and 50% relative humidity by rubbing a cotton pad containing Paliofast blue-rice starch (cyan) developing powder of about 5 to 6 microns across the element. After the cyan developing powder was embedded into the unexposed areas of the light-sensitive layer in the manner described in Example I, excess powder was removed to form a continuous-tone cyan reproduction of the positive transparency. The scanning electron microscope showed that a monolayer of particles was embedded in the image areas. The developed image was placed over a beaker of boiling water for about 15 seconds fusing the developing powder to the paper substrate.

The cyan-imaged sheet was recoated with the same light-sensitive lecithin composition, air dried, placed in register with the yellow continuous-tone separation positive, exposed to light for 30 seconds and developed with Chromophtal Y rice starch (yellow) developing powder in the manner described above. The yellow image was fused to the substrate by holding the developed image over a beaker of boiling water for about 15 seconds.

The cyan/yellow-imaged sheet was recoated with the same light-sensitive lecithin composition, air dried, placed in register with the magenta continuous-tone separation positive, exposed to light for 30 seconds and developed with Watchung Red B-rice starch (magenta) developing powder in the manner described above. The developing powder was fused to the substrate by holding the image over a beaker of boiling water for 15 seconds.

The cyan/yellow/magenta-imaged sheet was flow coated with the same light-sensitive lecithin composition, air dried, placed in register with the black continuous-tone separation positive, exposed to light for 30 seconds and developed with Xerox toner (black) in the manner described above. The Xerox toner was fused to the substrate by placing the element in a chamber containing trichloroethylene vapors maintained at room temperature for about five seconds. A satisfactory four-color continuous-tone reproduction was produced in this manner.

The rice starch developing powders employed in this example were prepared by milling 180 grams of rice starch with 20 grams pigment on a ball mill with porcelain balls for 16 hours.

Essentially the same results were obtained by replacing the rice starch in each of the developing powders with an equal weight of micronized animal glue and polyvinyl alcohol.

This example was repeated with essentially the same results by replacing the light-sensitive lecithin composition of this example with a composition comprising 5 grams of the ethanol-insoluble fraction of soybean lecithin and 0.2 gram benzil, dissolved in 100 mls. carbon tetrachloride and increasing the exposure time to 60 seconds.

EXAMPLE IV

This example illustrates the preparation of a three-color reproduction wherein dyes are employed in the developing powders and molecularly dispersed in the developing powder rather than imbibed into the surface of the substrate.

A solution of .64 gram Staybelite Ester No. 10, .16 gram benzil and .096 gram 4-methyl-7-dimethylaminocoumarin, dissolved in 100 mls. Chlorothene was flow coated over polyethylene terephthalate film supported at about a 60° angle with the horizontal. After air drying for approximately one minute, the light-sensitive layer was approximately 2.0 microns thick. The light-sensitive element was placed in a vacuum frame in contact with the yellow separation half-tone positive transparency and exposed to a carbon arc for about 60 seconds and developed with a tartrazine-polyvinyl alcohol (yellow) developing powder of from about 1 to 40 microns along the largest axis in the manner described in Example I. After the excess powder was removed from the light-sensitive layer, the developed image was placed over a beaker of boiling water for about 15 seconds during which time the pale yellow dye image was molecularly dispersed in the polyvinyl alcohol carrier in half-tone configuration on the polyethylene substrate. The molecularly dispersed image changed from a pale yellow to a brilliant, saturated, aesthetically more pleasing yellow hue.

The yellow-imaged sheet was recoated with the same light-sensitive Staybelite ester composition, air dried, placed in register with the half-tone magenta positive transparency, exposed to light in the vacuum frame and developed with Calcocid Phloxine 2G-polyvinyl alcohol developing powder (magenta) in the manner described above. After the excess developing powder was removed from the element, the developed image was placed over a beaker of boiling water for about 15 seconds, during which time the pale magenta dye image was molecularly dispersed in image-wise configuration into the polyvinyl alcohol carrier. The molecularly dispersed image changed from a pale magenta to a brilliant, saturated, aesthetically more pleasing magenta hue.

The yellow/magenta-imaged sheet was recoated with the same light-sensitive Staybelite ester composition, air dried, placed in register with the half-tone cyan separation positive, exposed to light for 60 seconds and developed with Alphazurine 2G-polyvinyl alcohol (cyan) developing powder of from about 1 to 40 microns in the manner described above. After the excess developing powder was removed, the image was placed over a beaker of boiling water for about 15 seconds, during which time the pale blue dye was molecularly dispersed in image-wise configuration into the polyvinyl alcohol carrier. The resultant image was an excellent three-color reproduction.

The developing powders used in this example were prepared by milling the indicated 200 grams of micronized polyvinyl alcohol and 20 grams dye on a ball mill with porcelain balls for 15 hours.

Essentially the same results were obtained by replacing the polyethylene terephthalate film with a paper substrate coated with cellulose acetate and with a fine-grained aluminum lithographic plate.

This example was repeated with essentially the same results except that each Staybelite ester layer was removed with a Chlorothene flush after molecular dispersion of each dye into its polyvinyl alcohol carrier.

EXAMPLE V

This example illustrates the preparation of a four-color reproduction employing the same material as a subbing layer for the light-sensitive element and as the carrier for the dye colorant.

A sheet of white, 80 lb. Lusterkote cover CIS paper was coated with a 10% solution of polyvinyl alcohol in water using a No. 14 wire-wound rod. After drying, the polyvinyl alcohol surface was flow coated with a solution consisting of .64 gram Staybelite Ester No. 10, .16 gram benzil and .096 gram 4-methyl-7-dimethylaminocoumarin dissolved in 100 mls. of Chlorothene with the sheet supported at about a 60° angle with the horizontal. After air drying for approximately one minute, the light-sensitive Staybelite layer was about 2 microns thick. The light-sensitive element was placed in a vacuum frame in contact with the yellow continuous-tone positive separation transparency, exposed to a mercury light point source for about 50 seconds and developed in a room maintained at 75° F. and 50% relative humidity with a Tartrazine-polyvinyl alcohol (yellow) developing powder of from about 1 to 10 microns diameter in the manner described in Example I. After the excess powder was removed, the scanning electron microscope showed that a monolayer of particles was embedded in the image areas. The developed image was placed over a beaker of boiling water for about 15 seconds, molecularly dispersing and imbibing the yellow dye into the polyvinyl alcohol subbing layer. The molecularly dispersed image changed from a pale yellow to a brilliant, saturated, aesthetically pleasing yellow hue. The element was then washed with Chloroethene by flushing the substrate at about a 60° angle with the horizontal to remove the Staybelite ester layer.

The yellow-image sheet was then recoated with the same light-sensitive Staybelite composition, air dried, placed in register with the magenta continuous-tone separation positive, exposed to light for 50 seconds and developed with Calcocid Phloxine 2G-polyvinyl alcohol (magenta) developing powder in the manner described above. After the excess developing powder was removed from the light-sensitive layer, the developed image was placed over a beaker of boiling water for about 15 seconds, during which time the pale magenta dye image was molecularly imbibed in image-wise configuration into the polyvinyl alcohol subbing layer. The yellow/magneta-image sheet was then flushed with Chlorothene to remove the Staybelite ester layer, air dried, recoated with the same light-sensitive Staybelite ester composition, air dried, placed in register with the continuous-tone cyan positive transparency, exposed to light in the vacuum frame and developed with an Alphazurine 2G-polyvinyl alcohol developing powder in the manner described above. After the excess developing powder was removed from the light-sensitive layer, the developed image was placed over a beaker of boiling water for about 15 seconds, during which time the pale cyan dye image was molecularly imbibed in image-wise configuration into the polyvinyl alcohol substrate. The Staybelite ester layer was removed with a Chlorothene wash, air dried, recoated with the same light-sensitive Staybelite ester composition, air dried, placed in register with the black continuous-tone positive transparency, exposed to light in the vacuum frame and developed with a Nigrosine-polyvinyl alcohol (black) developing powder. After the excess developing powder was removed from the light-sensitive layer, the developed image was placed over a beaker of boiling water for about 15 seconds, during which time the black dye image was molecularly imbibed in image-wise configuration into the polyvinyl alcohol subbing layer. The Staybelite ester layer was removed with a Chlorothene wash and permitted to air dry. The resulting full-color reproduction simulated the silver halide color original from which the color separation positive transparencies were made.

The developing powders employed in this example were prepared by ball milling for 16 hours 200 grams of polyvinyl alcohol with (a) 20 grams tartrazine, (b) 10 grams Calcocid Phloxine 2G, (c) 10 grams Alphazurine 2G and (d) 20 grams Nigrosine.

When this example was repeated by replacing the Lusterkote paper base with a sheet of glass, the resulting full-color reproduction was aesthetically pleasing when viewed by transmitted light and is ideal for projection slide viewing.

EXAMPLE VI

Example V was repeated with essentially the same results except that the paper base sheet was coated first with cellulose acetate, dried and then recoated with polyvinyl alcohol before the application of the first light-sensitive Staybelite ester composition. The cellulose acetate served as a moisture barrier between the water-sensitive coating and the base paper, minimizing dimensional changes and warp tendencies exhibited by some paper substrates when they are subjected repeatedly to water vapor.

EXAMPLE VII

This example illustrates the use of a negative-acting, light-sensitive coating to produce full color reproductions from negative half-tone color separation transparencies.

A sheet of white, 80 lb. Lusterkote cover CIS paper was flow coated with a solution consisting of 1.5 grams Paracin 15 (ethylene glycol monohydroxy stearate), 0.2 gram benzil and 0.2 gram 4-methyl-7-dimethylaminocoumarin dissolved in 100 mls. of Chlorothene with the sheet supported at about a 60° angle with the horizontal. The light-sensitive element was placed in a vacuum frame in contact with the yellow half-tone negative color separation transparency, exposed for about 50 seconds to a mercury light source and developed in the manner described in Example V except that the powder particles were embedded into the exposed areas of the light-sensitive layer. After the non-embedded particles were removed, the yellow dye was molecularly imbibed into the polyvinyl alcohol subbing layer by holding the element over boiling water for about 15 seconds. The molecularly dispersed image changed from a pale yellow to a brilliant, saturated, aesthetically pleasing yellow hue. The element was washed with Chlorothene to remove the light-sensitive ethylene glycol monohydroxy stearate layer, air dried and the processing steps repeated in the manner described above and in Example V to form a three-color positive reproduction.

EXAMPLE VIII

This example illustrates the preparation of a two-color reproduction utilizing dye imbibition of two hydrophobic dyes into a hydrophobic subbing layer. Baryta paper bearing a ⅓ mil. polyethylene layer was flow coated with a composition consisting of 1.25 grams Staybelite resin (partially hydrogenated rosin acids), 0.10 gram benzil and 0.316 gram 4-methyl-7-dimethylaminocoumarin, dissolved in 100 mls. Chlorothene. The light-sensitive element was exposed through a metal stencil mask for 60 seconds to a 275 watt sunlamp and developed with rice starch bearing an oil-soluble blue dye in the manner described in Example I. The element was placed in a chamber having a Chlorothene vapor atmosphere at room temperature for about 20 seconds, molecularly imbibing the dye particles into the polyethylene layer. The Staybelite resin and substantially all of the rice starch particles were removed from the substrate by flushing with ethanol. The element was dried, resensitized with the above described Staybelite resin composition, air dried, placed in register with a second metal stencil mask, exposed to light for 60 seconds to a 275 watt sunlamp and developed with rice starch bearing an oil-soluble blue dye in the manner described above. The element was placed in a chamber having a saturated Chlorothene atmosphere at room temperature for about 20 seconds, molecularly imbibing the dye particles into the polyethylene layer. The Staybelite resin layer and substantially all of the rice starch granules were removed from the substrate by flushing with ethanol forming a two-color reproduction.

The developing powders used in this example were prepared by blending 1.80 grams rice starch suspended in Chlorothene with (a) 0.2 gram American Cyanamid Oil Blue CV and (b) 0.2 gram American Cyanamid Oil Red N–1700, evaporated to dryness on a hot plate at 50° C. and grinding with a mortar and pestle.

EXAMPLE IX

This example illustrates the preparation of a two-color reproduction, wherein a polyvinyl alcohol isolating layer is applied to the first image. Sixty-four hundredths of a gram of Staybelite Ester No. 10, .16 gram benzil and .096 gram 4-methyl-7-dimethylaminocoumarin, dissolved in 100 mls. Chlorothene, was applied to the gelatin side of a hardened-gelatin-coated paper by flow coating the solution over the substrate supported at about a 60° angle with the horizontal. After air drying, the light-sensitive element was placed in a vacuum frame in contact with a yellow separation half-tone positive transparency and exposed to a mercury light point source for about 60 seconds, developed with a commercially available yellow developing powder comprising a yellow pigment and a Chlorothene soluble resin in the manner described in Example I. After the excess powder was removed from the light-sensitive layer, the developing powder was fused to the substrate by placing the element in a chamber having a saturated Chlorothene atmosphere at room temperature for about 20 seconds. After air drying, the element was whirl coated with a 5% aqueous solution of polyvinyl alcohol and dried. The yellow-imaged sheet was recoated with the above described light-sensitive composition, air dried, placed in register with a magenta half-tone separation positive transparency, exposed to light for 60 seconds and developed with a commercially available developing powder composed of Chlorothene soluble resin and a red pigment. After the excess developing powder was removed from the light-sensitive layer, the element was placed in a chamber having a saturated Chlorothene atmosphere at room temperature for about 20 seconds, fusing the magenta developing powders to the substrate resulting in an excellent two-color reproduction.

EXAMPLE X

Example IX was repeated except that the second light-sensitive layer was developed with a developing powder comprising 95 parts by weight Pliolite VTL and 5 parts by weight Phloxine 2G. After the non-embedded particles were removed from the substrate, the element was placed over a beaker of boiling water for 15 seconds molecularly imbibing the red dye into the polyvinyl alcohol isolating layer.

EXAMPLE XI

Example IX was repeated with essentially the same results except that neither of the developing powders was fused to the substrate.

Since many embodiments of this invention may be made and since many changes may be made in the embodiments described, the foregoing is to be interpreted as illustrative only and our invention is defined by the claims appended hereafter.

What is claimed is:

1. The method of forming a multicolor reproduction which comprises:

(1) coating a substrate bearing a first color in image-wise configuration with a solid, light-sensitive organic layer in the form of a film having a thickness of 0.1 to 40 microns while maintaining said first color in its image-wise configuration, said light-sensitive organic layer being capable of developing a $R_d$ of 0.2 to 2.2;

(2) exposing said light-sensitive organic layer to actinic radiation in image-receiving manner to establish a potential $R_d$ of 0.2 to 2.2;

(3) applying to said layer of organic material, free flowing powder particles of a second color having a diameter along at least one axis of at least about 0.3 micron but less than 25 times the thickness of said organic layer;

(4) while the layer is at a temperature below the melting points of the powder and of the organic layer, mechanically embedding said powder particles as a monolayer in a stratum at the surface of said light-sensitive layer to yield an image having portions varying in density in proportion to the exposure of each portion; and (5) removing non-embedded particles from said organic layer to develop a multicolor reproduction.

2. The process of claim 1, wherein said solid, light-sensitive organic layer is applied from a liquid vehicle.

3. The process of claim 1, wherein said first color is embedded in image-wise configuration into a solid, organic layer on the surface of said substrate.

4. The process of claim 3, wherein said solid, light-sensitive organic layer is applied from a liquid vehicle, which is a poor solvent for the components of said first color and solid, organic layer on the surface of said substrate.

5. The process of claim 1, wherein said first color is imbibed in image-wise configuration into the surface of said substrate.

6. The process of claim 5, wherein said solid, light-sensitive organic layer is applied from a liquid vehicle, which is a poor solvent for the surface of said substrate.

7. The method of forming a multicolor reproduction which comprises:

(1) exposing to actinic radiation in image-receiving manner an element comprising a substrate bearing a first solid, light-sensitive organic layer, in the form of a film having a thickness of 0.1 to 40 microns, capable of developing a $R_d$ of 0.2 to 2.2;

(2) continuing the exposure to establish a potential $R_d$ of 0.2 to 2.2;

(3) applying to said first layer of organic material, free flowing powder particles of a first color having a diameter along at least one axis of at least about 0.3 micron but less than 25 times the thickness of said first organic layer;

(4) while the element is at a temperature below the melting points of the powder and of the first organic layer, mechanically embedding said powder particles as a monolayer in a stratum at the surface of said first organic layer to yield an image having portions varying in density in proportion to the exposure of each portion;

(5) removing non-embedded particles from said first organic layer to develop an image;

(6) coating said element with a second solid, light-sensitive organic layer, in the form of a film having a thickness of 0.1 to 40 microns, while maintaining said first color in its image-wise configuration, said second light-sensitive organic layer being capable of developing a $R_d$ of 0.2 to 2.2;

(7) exposing said second light-sensitive organic layer to actinic radiation in image-receiving manner to establish a potential $R_d$ of 0.2 to 2.2;

(8) applying to said second layer of organic material, free flowing powder particles of a second color having a diameter along at least one axis of at least about 0.3 micron but less than 25 times the thickness of said second organic layer;

(9) while the element is at a temperature below the melting points of the second powder and of the second organic layer, mechanically embedding said powder particles as a monolayer in a stratum at the surface of said second light-sensitive layer to yield an image having portions varying in density in proporton to the exposure of each portion; and

(10) removing non-embedded particles from said second organic layer to develop a multicolor reproduction.

8. The process of claim 7, wherein said powder particle of said first color comprises a carrier and a colorant.

9. The process of claim 8, wherein said first colorant comprises a pigment.

10. The process of claim 8, wherein said first colorant comprises a dye.

11. The process of claim 8, wherein said second solid, light-sensitive organic layer is applied from a liquid vehicle.

12. The process of claim 7, wherein a transparent isolating layer is applied to said element before step 6.

13. The process of claim 12, wherein said isolating layer comprises a hydrophilic polymeric material.

14. The process of forming a multicolor reproduction which comprises:

(1) contacting a substrate bearing a solid, organic layer, in the form of a film having a thickness of 0.1 to 40 microns, holding a monolayer of powder particles comprising a solid carrier and dye of a first color in image-wise configuration in particulate form, with vapors of a material and transporting said first dye through said solid, organic layer, molecularly imbibing said dye into said substrate, wherein said material is a solvent for said dye, capable of swelling the surface of said substrate and capable of transporting said dye through said solid, organic layer;

(2) coating said substrate with a solid, light-sensitive organic layer, in the form of a film having a thickness of 0.1 to 40 microns, while maintaining said first color in its image-wise configuration, said light-sensitive organic layer being capable of developing a $R_d$ of 0.2 to 2.2;

(3) exposing said light-sensitive organic layer to actinic radiation in image-receiving manner to establish a potential $R_d$ of 0.2 to 2.2;

(4) applying to said layer of said organic material free flowing powder particles of a second color having a diameter along at least one axis of at least about 0.3 micron but less than 25 times the thickness of said said organic layer;

(5) while the layer is at a temperature below the melting points of the powder and of the organic layer, mechanically embedding said powder particles as a monolayer in a stratum at the surface of said light-sensitive layer to yield an image having portions varying in density in proportion to the exposure of each portion; and (6) removing non-embedded particles from said organic layer to develop a multicolor reproduction.

15. The process of claim 14, wherein said powder particles of a second color comprises a solid carrier and a colorant.

16. The process of claim 15, wherein said solid, light-sensitive organic layer in step 2 is applied from a liquid vehicle which is a poor solvent for the surface of said substrate.

17. The process of claim 15, wherein said colorant comprises a pigment.

18. The process of claim 15, wherein said carrier comprises a fusible material and said fusible material is fused to said substrate after step 6.

19. The process of claim 15, wherein said colorant comprises a dye.

20. The process of claim 19, wherein said dye is molecularly imbibed and transported into said substrate in image-wise configuration after step 6 by treating said substrate with vapors of a material which is a solvent for said dye capable of swelling the surface of said substrate and capable of transporting said dye through said solid organic layer.

21. The process of claim 19, wherein the surface of said substrate is hydrophilic.

22. The process of claim 20, wherein said dye is water-soluble and said dye is imbibed into said substrate with vapors of water.

23. The process of forming a multicolor reproduction which comprises:

(1) treating a substrate bearing a solid, organic layer, in the form of a film having a thickness of 0.1 to 40 microns, holding a monolayer of powder particles comprising a solid carrier and a dye of a first color in image-wise configuration in particulate form with vapors of a material and transporting said first dye through said solid, organic layer, molecularly imbibing said dye into said substrate, wherein said material is a solvent for said dye, capable of swelling the surface of said substrate and capable of transporting said dye through said solid, organic layer;

(2) removing said solid, organic layer with a material, which is a solvent for said solid, organic layer and a poor solvent for the surface of the substrate;

(3) coating said substrate with a solid, light-sensitive organic layer, in the form of a film having a thickness of 0.1 to 40 microns, while maintaining said first color in its image-wise configuration, said light-sensitive organic layer being capable of developing a $R_d$ of 0.2 to 2.2;

(4) exposing said light-sensitive organic layer to actinic radiation in image-receiving manner to establish a potential $R_d$ of 0.2 to 2.2;

(5) applying to said layer of said organic material free flowing powder particles of a second color having a diameter along at least one axis of at least about 0.3 micron but less than 25 times the thickness of said organic layer;

(6) while the layer is at a temperature below the melting points of the powder and the organic layer, mechanically embedding said powder particles as a monolayer in a stratum at the surface of said light-sensitive layer to yield an image having portions varying in density in proportion to the exposure of each portion; and (7) removing non-embedded particles from said organic layer to develop a multicolor reproduction.

24. The process of claim 23, wherein said solid, organic layer contains no terminal ethylenic unsaturation.

25. The process of claim 23, wherein said powder particles of a second color comprise a solid carrier and a colorant.

26. The process of claim 25, wherein said colorant comprises a pigment.

27. The process of claim 25, wherein said solid carrier comprises a fusible material and said fusible material is fused to said substrate after step 7.

28. The process of claim 25, wherein said colorant comprises a dye.

29. The process of claim 28, wherein said dye is molecularly imbibed and transported into said substrate in image-wise configuration after step 7 by treating said substrate with vapors of a material which is a solvent for said dye capable of swelling the surface of said substrate and capable of transporting said dye through said solid, organic layer.

30. The process of claim 29, wherein the surface of said subtrate is hydrophilic.

31. The process of claim 30, wherein said dye is water-soluble and said dye is imbibed into said substrate with vapors of water.

32. The process of claim 29, wherein said solid, organic layer is removed by treating said element with a material which is a solvent for said solid, organic layer and a poor solvent for the surface of the substrate after imbibing said second colorant into the surface of said substrate.

33. The process for forming a multicolor reproduction which comprises:

(1) contacting a substrate bearing a solid, organic layer, in the form of a film having a thickness of 0.1 to 10 microns, holding a monolayer of powder particles comprising a solid carrier and dye of a first color in image-wise configuration in particulate form, with vapors of a material and transporting said first dye through said solid, organic layer, molecularly imbibing said dye into said substrate, wherein said material is a solvent for said dye, capable of swelling the surface of said substrate and capable of transporting said dye through said solid, organic layer;

(2) coating said substrate with a solid, light-sensitive organic layer in the form of a film having a thickness of 0.1 to 10 microns from a liquid vehicle which is a poor solvent for the surface of said substrate, while maintaining said first color in its image-wise configuration, said light-sensitive organic layer being capable of developing a $R_d$ of 0.2 to 2.2;

(3) exposing said light-sensitive organic layer to actinic radiation in image-receiving manner to establish a potential $R_d$ of 0.2 to 2.2;

(4) applying to said layer of said organic material free flowing powder particles of a second color having a diameter along at least one axis of at least about 0.3 micron but less than 25 times the thickness of said organic layer;

(5) while the layer is at a temperature below the melting points of the powder and the organic layer, mechanically embedding said powder particles as a monolayer in a stratum at the surface of said light-sensitive layer to yield an image having portions varying in density in proportion to the exposure of each portion; and (6) removing non-embedded particles from said organic layer to develop a multicolor reproduction.

34. The process of claim 33, wherein said solid, light-sensitive organic layer applied in step 2 comprises a film-forming organic material containing no terminal ethylenic unsaturation and at least one photoactivator.

35. The process of claim 34, wherein said solid, film-forming organic material comprises an internally ethylenically unsaturated acid.

36. The process of claim 35, wherein said solid, film-forming organic material comprises a partially hydrogenated rosin acid.

37. The of claim 34, wherein said solid, film-forming organic material comprises an ester of an internally ethylenically unsaturated acid.

38. The process of claim 37, wherein said ester comprises a partially hydrogenated rosin ester.

39. The process of claim 37, wherein said ester comprises a phosphatide.

40. The process of claim 34, wherein said solid, film-forming organic material comprises a polymer of an ethylenically unsaturated monomer.

41. The process of claim 34, wherein said solid, film-forming organic material comprises a halogenated hydrocarbon.

42. The process of claim 34, wherein said vehicle comprises a hydrocarbon.

43. The process of claim 34, wherein said vehicle comprises a halohydrocarbon.

44. The method of forming a multicolor reproduction which comprises:

(1) coating a substrate having a hydrophilic surface with a solution of a light-sensitive organic film former containing no terminal ethylenic unsaturation to form a light-sensitive organic layer in the form of a film of 0.1 to 10 microns, capable of developing a $R_d$ of 0.2 to 2.2 from a vehicle comprising a member selected from the group consisting of hydrocarbons and halohydrocarbons;

(2) exposing said light-sensitive organic layer to actinic radiation in image-receiving manner to establish a potential $R_d$ of 0.2 to 2.2;

(3) applying to said layer of organic material, free flowing powder particles comprising a water-soluble dye and carrier, said powder particles having a diameter along at least one axis of at least 0.3 micron;

(4) while the layer is at a temperature below the melting points of the powder and of the light-sensitive organic layer, mechanically embedding said powder particles as a monolayer in a stratum at the surface of said light-sensitive layer to yield an image having portions varying in density in proportion to the exposure of each portion;

(5) removing non-embedded particles from said organic layer to develop an image;

(6) transporting said water-soluble dye through said solid, organic layer, molecularly imbibing said dye into the hydrophilic substrate by contacting the particles embedded in said organic layer with vapors of water;

(7) removing said organic layer with an organic solvent comprising at least one member selected from the group consisting of halohydrocarbon and hydrocarbon;

(8) coating the substrate bearing the first color in image-wise configuration in or on the surface of said substrate with a second solid, light-sensitive organic film former containing no terminal ethylenic unsaturation to form a light-sensitive organic layer, in the form of a film of 0.1 to 10 microns, capable of developing a $R_d$ of 0.2 to 2.2 from a liquid vehicle comprising a member selected from the group consisting of hydrocarbon and halohydrocarbon;

(9) exposing said light-sensitive organic layer to actinic radiation in image-receiving manner to establish a potential $R_d$ of 0.2 to 2.2;

(10) applying to said layer of organic material free flowing powder particles comprising a second water-soluble dye and carrier, said powder particles having a diameter along at least one axis of at least 0.3 micron;

(11) while the layer is at a temperature below the melting points of the powder and of the organic layer, mechanically embedding said powder particles as a monolayer in a stratum at the surface of said light-sensitive layer to yield an image having portions varying in density in proportion to the exposure of each portion;

(12) removing non-embedded particles from said organic layer to develop a multicolor reproduction; and

(13) transporting said water-soluble dye through said solid, organic layer, molecularly imbibing said dye into the hydrophilic substrate by contacting the particles embedded in said organic layer with vapors of water.

45. The process of claim 44, wherein said organic layer is removed after step 13 with an organic solvent comprising at least one member selected from the group consisting of halohydrocarbon and hydrocarbon.

46. The process of claim 45, wherein after said organic layer is removed, the substrate is coated with a third solid, light-sensitive organic film former containing no terminal ethylenic unsaturation to form a light-sensitive layer, in the form of a film of 0.1 to 10 microns, capable of developing a $R_d$ of 0.2 to 2.2 from a liquid vehicle comprising a member selected from the group consisting of hydrocarbon and halohydrocarbon; exposing said light-sensitive organic layer to actinic radiation in image-receiving manner to establish a potential $R_d$ of 0.2 to 2.2; applying to said layer of organic material free-flowing powder particles comprising a third water-soluble dye and carrier, said powder particles having a diameter along at least one axis of at least 0.3 micron; while the layer is at a temperature below the melting points of powder and of the organic layer, mechanically embedding said powder particles as a monolayer in a stratum at the surface of said light-sensitive layer to yield an image having portions varying in density in proportion to the exposure of each portion; removing non-embedded particles from said organic layer to develop a multicolor reproduction; and transporting said water-soluble dye through said solid, organic layer, molecularly imbibing said dye into the hydrophilic substrate by contacting the particles embedded in said organic layer with vapors of water.

References Cited

UNITED STATES PATENTS

| | | | |
|---|---|---|---|
| 2,273,305 | 2/1942 | Whitehead | 8—14 |
| 3,558,342 | 1/1971 | Tanno et al. | 117—63 |

DAVID KLEIN, Primary Examiner

A. T. SURO PICO, Assistant Examiner

U.S. Cl. X.R.

96—2, 13, 115, 119; 117—1.7, 37